(12) United States Patent
Dao et al.

(10) Patent No.: US 10,358,043 B2
(45) Date of Patent: *Jul. 23, 2019

(54) GOLF CART BATTERY SYSTEM

(71) Applicant: Elite Power Solutions, LLC, Chandler, AZ (US)

(72) Inventors: Yuan Dao, Chandler, AZ (US); William Jeffrey Schlanger, Flagstaff, AZ (US); Jennifer Dao, Chandler, AZ (US)

(73) Assignee: Elite Power Solutions, LLC, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/702,670

(22) Filed: Sep. 12, 2017

(65) Prior Publication Data

US 2018/0354375 A1    Dec. 13, 2018

Related U.S. Application Data

(63) Continuation-in-part of application No. 15/658,156, filed on Jul. 24, 2017, now Pat. No. 10,116,149, (Continued)

(51) Int. Cl.
| | | |
|---|---|---|
| *H02J 7/00* | (2006.01) | |
| *B60L 11/18* | (2006.01) | |
| *G01R 31/36* | (2019.01) | |
| *B60L 53/14* | (2019.01) | |
| *B60L 53/60* | (2019.01) | |
| *B60L 58/12* | (2019.01) | |
| *H02J 7/04* | (2006.01) | |

(52) U.S. Cl.
CPC .......... *B60L 11/1816* (2013.01); *B60L 53/14* (2019.02); *B60L 53/60* (2019.02); *B60L 58/12* (2019.02); *G01R 31/3646* (2019.01); *H02J 7/007* (2013.01); *H02J 7/0047* (2013.01); *H02J 7/047* (2013.01); *B60L 2200/22* (2013.01); *H02J 7/0014* (2013.01); *H02J 2007/005* (2013.01); *H02J 2007/0098* (2013.01)

(58) Field of Classification Search
CPC .............................. B60L 11/1816; B60L 53/14
USPC ........................................................ 320/112
See application file for complete search history.

(56) References Cited

U.S. PATENT DOCUMENTS

| | | |
|---|---|---|
| 6,406,806 B1 | 6/2002 | Keskula et al. |
| 7,932,702 B1 | 4/2011 | Patino et al. |

(Continued)

*Primary Examiner* — Richard V Muralidar
(74) *Attorney, Agent, or Firm* — Invention To Patent Services; Alex Hobson

(57) ABSTRACT

An automatic rechargeable battery control module for a vehicle, such as a golf cart incorporates an automatic battery control system that automatically switches from charge to discharge modes with a single relay, thereby preventing the need to manually reset a relay switch due to an over or under voltage situation. An automatic battery control circuit is coupled with a battery management system and a relay contactor is opened and closed by a signal from the battery management system. The battery management system monitors a state of charge of the battery unit as well as current flow to and from a battery unit. The automatic rechargeable battery control module may have a state of charge output that is connected with a state of charge indicator to inform a driver of an approximate driving range or time remaining.

20 Claims, 30 Drawing Sheets

Related U.S. Application Data which is a continuation-in-part of application No. 14/657,972, filed on Mar. 13, 2015, which is a continuation-in-part of application No. 13/077,136, filed on Mar. 31, 2011, now Pat. No. 9,000,935.

(56) References Cited

U.S. PATENT DOCUMENTS

| | | | |
|---|---|---|---|
| 8,004,249 B2 * | 8/2011 | Lim | H02J 7/0018 |
| | | | 320/166 |
| 8,219,333 B2 | 7/2012 | Li | |
| 8,258,747 B2 | 9/2012 | Andres et al. | |
| 8,350,519 B2 | 1/2013 | Brantner et al. | |
| 8,350,529 B2 | 1/2013 | Loncarevic | |
| 8,860,423 B2 * | 10/2014 | Miyamoto | G01R 31/025 |
| | | | 324/433 |
| 8,872,474 B2 | 10/2014 | Scheucher | |
| 10,084,334 B1 * | 9/2018 | Dao | H02J 7/0027 |
| 10,116,149 B1 * | 10/2018 | Dao | H02J 7/0029 |
| 2003/0186894 A1 * | 10/2003 | Kuo | A61K 9/0075 |
| | | | 514/21.91 |
| 2004/0249534 A1 | 12/2004 | Yamada et al. | |
| 2007/0176604 A1 | 8/2007 | Morimoto | |
| 2011/0140650 A1 | 6/2011 | Zhang et al. | |
| 2011/0234231 A1 | 9/2011 | Liu et al. | |
| 2011/0279087 A1 | 11/2011 | Andres et al. | |
| 2012/0116628 A1 | 5/2012 | Clark et al. | |
| 2012/0319658 A1 | 12/2012 | White et al. | |
| 2014/0312848 A1 | 10/2014 | Alexander et al. | |

* cited by examiner

GOLF CART BATTERY SYSTEM

CROSS REFERENCE TO RELATED APPLICATIONS

This application is a continuation in part of U.S. patent application Ser. No. 15/658,156 filed on Jul. 24, 2017, entitled Automatic Control System For A Rechargeable Battery System and current pending, which is a continuation in part of U.S. patent application Ser. No. 14/657,972 filed on Mar. 13, 2015 and currently pending, which is a continuation in part of U.S. patent application Ser. No. 13/077,136, filed on Mar. 31, 2011 and issued as U.S. Pat. No. 9,000,935 on Apr. 7, 2015, the entirety of all applications are hereby incorporated by reference herein.

BACKGROUND OF THE INVENTION

Field of the Invention

The invention is directed to an automatic rechargeable battery control module for a vehicle, such as a golf cart, having an automatic control system that automatically switches the module between charging and discharging modes depending on what is connected to the module and the state of charge of the battery or batteries.

Background

Current battery management systems obtain data about individual battery units in a battery system. The systems reserve addresses for communication with battery unit sensors and/or battery units. When sensors transmit data about battery units to the management system, the sensors include the address of the battery unit. Such a system may require significant amounts or resources and complex arrangements for connecting the components of the system.

As shown in FIG. 19, lithium batteries have a non-linear discharge profile, with a relatively flat discharge region up to about 80% discharged. Therefore, a small change in voltage can mean a large difference in the state of charge, unlike a lead acid battery that has a relatively linear drop in voltage as the battery is discharged. The state of charge of a lead acid battery, and therefore the amount of power remaining, is more easily monitored by a UPS system by simply monitoring the voltage of the lead acid battery. The amount of power remaining in a lithium battery system is more difficult to monitor and predict however by simply measuring voltage. It would therefore be more difficult to determine the available power remaining in a lithium battery unit by simply measuring the voltage.

Current charging systems are configured to charge a battery pack to a predetermined voltage. However, the individual battery may not be charged to the same level, and the discrepancy between the batteries state of charge levels can cause capacity to be limited. The battery pack capacity is limited to the capacity of the lowest battery unit. Additionally, when some battery units have lower state-of-charge levels, as the battery discharges, those units may discharge to a level resulting in permanent loss of charging capacity.

Current battery control systems for rechargeable batteries that have over-charge and under-charge protection features typically utilize two relays or contactors that open to isolate the battery system in the event of an over-charge or under-charge condition. The two relays may be in series and require a manual reset. They may use two parallel relays in parallel and each has a diode to control flow of current to and from the battery. This system is complex and requires expensive components.

SUMMARY OF THE INVENTION

The invention is directed to an exemplary automatic rechargeable battery control module for a vehicle, such as a golf cart that automatically switches from discharge to charging modes. The exemplary automatic rechargeable battery control module incorporates an automatic control system that automatically switches from a charging mode to a power discharging mode and does not require any manual resetting to switch from one mode to the other. In addition, exemplary automatic rechargeable battery control module monitors the battery or battery pack including state of charge to prevent overcharging or dropping below a lower threshold state of charge. The exemplary automatic rechargeable battery control module may also monitor the temperature of a battery within the battery pack utilizing a temperature sensor.

The exemplary automatic rechargeable battery control module may be incorporated into a vehicle, such as a golf cart and greatly simplifies operation. A user may simply install the exemplary automatic rechargeable battery control module in the vehicle and connect the power cable from the vehicle to the exemplary automatic rechargeable battery control module. The power cable may provide power to the electric motors that drive the vehicle, lights, stereo and other electrical accessories. In an exemplary embodiment, the exemplary automatic rechargeable battery control module has a state of charge output that is connected with a state of charge (SOC), indicator. The indicator may be configured for the driver of the vehicle to monitor the state of charge of the battery pack, the estimated remaining mileage and/or estimated driving time. An exemplary state of charge indicator may be in the dash or the front of the vehicle and may comprises a plurality of indicator lights that are illuminated to indicate a relative state of charge. For example, a state of charge indicator may comprise six lights and when only three are illuminated, the state of charge may be one half of a full state of charge, or state of charge when the battery pack is fully charged.

An exemplary automatic rechargeable battery control module may comprise a charging port and a user or the vehicle simply has to plug in the charger cable into the charging port to charge the battery pack. The automatic control system of the exemplary automatic rechargeable battery control module will recognize the input of the power source and will switch from a discharge mode to a charge mode, if the state of charge of the batteries warrants charging and is below charge threshold limit state of charge. This is a state of charge below the upper threshold limit.

An exemplary automatic rechargeable battery control module may also comprise a video port and a mode button to allow a user to run diagnostics on the battery pack. A video cable may be connected with the video port and an electronic device that displays metrics of a battery within the battery pack and/or the entire battery pack metrics. An exemplary mode button may allow a user to toggle through the batteries within the battery pack and may be used to identify a battery having some problems, such as low state of charge or too high of a temperature. Metrics that may be viewed include, but are not limited to state of charge, temperature, run hours, state of charge history and the like.

An exemplary automatic rechargeable battery control module may be configured for use on a vehicle, such as a golf cart. The battery pack may comprise for sets of four batteries connected in series to produce a nominal 48V battery pack, when lithium ion batteries are used, having a nominal full state of charge voltage of about 3.2 volts. An exemplary battery pack may have about 60 Ahours power capacity and this is sufficient for golf cart applications.

An exemplary automatic rechargeable battery control comprises a low voltage disconnect, LVD, that discontinues power supply from the batteries if the state of charge of the battery or battery pack drops below a lower threshold state of charge. The automatic battery control system and/or the microprocessor and sensors, may be powered by battery pack and this parasitic power can reduce the state of charge of the batteries to a lower threshold limit. The low voltage disconnect will discontinue power from the battery pack in the event the state of charge drops below a lower threshold value. This prevents any damage to the batteries from over discharging. Likewise, an exemplary automatic rechargeable battery control comprises an over voltage disconnect that discontinues power supply to the batteries if the state of charge of the battery or battery pack rises above an upper threshold state of charge. This will prevent damage to the batteries from an over voltage condition, or over charging the batteries.

An exemplary automatic rechargeable battery control module incorporates an automatic battery control system for a rechargeable battery system that enables the batteries to be switched from a charging mode to a discharging mode automatically. An exemplary automatic battery control system comprises a parallel resistor configured in parallel with a contactor of the relay, or relay contactor as used herein, that is configured to isolate the battery from the load and/or power source or charger. The parallel resistor has a high resistance value so very little current flows through the resistor but the relay potential, either positive or negative, of the parallel resistor is sensed by a difference amplifier and indicated by an optocoupler to a microprocessor. A parallel resistor may have a resistance value that produces a voltage of about 0.2V between a battery and a minimum load. This 0.2V potential is then amplified by a difference amplifier. When a load is connected to the automatic battery control circuit, or battery unit, the output side of the relay contactor and parallel resistor drops in voltage below the voltage on the input side, or below the battery voltage, thereby producing a negative relay potential. When a power source or charger is connected to the automatic battery control circuit, or battery unit, the output side of the relay contactor and parallel resistor increases in voltage above the voltage on the input side, or above the battery voltage, thereby producing a positive relay potential.

A battery management system measures the state of charge of the battery and has set limits for over-voltage and under-voltage. An exemplary battery management system has an over-voltage output for providing an over-voltage output signal when the measured state of charge of the battery is above an upper threshold limit. An exemplary battery management system has an under-voltage output for providing an under-voltage output signal when the measured state of charge of the battery is below a lower threshold limit. The upper and lower threshold limits may be set to avoid damage to the battery from over discharging or over charging, and may be factory set limits, or set by a user. In this system, the under-voltage output signals are ignored when in the charging mode and the over-voltage output signals are ignored when in the discharging mode. The system automatically switches from discharge to charge without any manual reset and with only one relay contactor.

An exemplary automatic battery control system comprises a battery system that may comprise a plurality of battery units and these battery units may be coupled in series or parallel. An exemplary automatic battery control system comprises a microprocessor that is coupled with the battery management system and the automatic battery control system. The microprocessor receives state of charge information from the battery management system and provides control of a transistor that opens and closes the relay contactor of the relay. A microprocessor also receives input from a first and charge optocoupler that are coupled with the difference amplifier. The optocoupler provides input to the microprocessor of the mode, either charging or discharging. When a load is connected, the voltage on an output side of the relay contactor and the parallel resistor will drop, and this drop or negative potential across the relay contactor from the input side to the output side, as measured by the parallel resistor, is sensed by the difference amplifier and indicated to the microprocessor by the discharge optocoupler. When in a discharge mode, the relay potential is negative indicating that current in flowing from the battery to the load, and this is provided to the microprocessor through the discharge optocoupler. When a power source or charger is connected, the voltage on an output side of the relay contactor and the parallel resistor will rise, and this increase or positive potential across the relay contactor from the input side to the output side, as measured by the parallel resistor is sensed by the difference amplifier and indicated to the microprocessor by the charge optocoupler. When in a charge mode, the relay potential is positive indicating that current in flowing to the battery, and this is provided to the microprocessor through the charge optocoupler. The battery management system comprises a current flow output, a MODBUS for example, that provides a current signal to the microprocessor of the current flow direction into and out of the battery. An exemplary battery management system may be powered by an isolated power supply that may be powered by a 5V power supply that runs the system.

An exemplary automatic battery control system comprises an automatic battery control circuit coupled to the battery management system, the microprocessor and the battery unit. An automatic battery control circuit comprises a single relay having a single relay contactor and transistor. In addition, the automatic battery control circuit parallel resistor configured in parallel with the relay contactor, from the input side to the output side of the relay contactor.

An exemplary automatic battery control system can switch automatically from a discharge mode to a charge mode. In a discharge mode, when no under-voltage signal is received by the microprocessor from the under-voltage output, the microprocessor will close the relay contactor by a transistor. With the relay contactor is closed, the relay potential, as measured by the parallel resistor, will be substantially zero, and the output of the charge optocoupler will turn off preventing any over-voltage signals from causing the relay to be opened. The relay will remain closed as long as the current flow output (MODBUS) provides a current signal of a current flowing to the load. When said current signal of a current flowing to the load stops, the microprocessor will open the relay contactor thereby isolating the battery from the load. The microprocessor will also open the relay contactor when an upper threshold limit is detected by the battery management system, thereby preventing over discharging of the battery unit.

In a charge mode, when no over-voltage signal is received by the microprocessor from the over-voltage output, the microprocessor will activate the relay contactor to close by the transistor. With the relay contactor closed, the relay potential, as measured by the parallel resistor, will be substantially zero, and the output of discharge optocoupler will turn off preventing any under-voltage signals from causing the relay contactor to be opened. The relay contactor will remain closed as long as the current flow output (MODBUS) provides a current signal of a current flowing to the battery unit. When the current signal of a current flowing to the battery unit stops, the microprocessor will open the relay thereby isolating the battery unit from the power source or charger. The microprocessor will also open the relay contactor when an lower threshold limit is detected by the battery management system, thereby preventing overcharging of the battery unit.

When the relay contactor is open, there is a high resistance between the input and output side of the relay contactor, or the parallel resistor, and therefore a potential across the parallel resistor can be measured by the difference amplifier. However, when the relay contactor is closed, current will flow through the relay and there will be little current flowing through the resistor, as it is a high resistance value resistor of 1,000 ohms or more, about 10 k ohms or more, about 100 kohms or more, and any rage between and including the resistance values provided. The resistance value of the parallel resistor is chosen to provide a voltage potential across the resistor of about 0.2V when a battery that has a state of charge between the upper and lower threshold limits, or charge and discharge threshold limits, is connected to a minimum load. As long as there is no load or power source or charger connected to the battery unite, there is no voltage across the resistor. When the output side or output voltage of the relay contactor rises above the battery voltage, due to connection of a power source or charger, it will close the relay contactor to turn it on, assuming the battery unit is below a threshold charge limit state of charge. And, when the output side or output voltage of the relay contactor drops below the battery voltage, due to connection of a load, it will close the relay contactor to turn it on, assuming the battery unit is above a threshold discharge limit state of charge. The threshold charge limit and upper threshold limits may be the same or substantially the same value, such as within about 5% of each other. Likewise, the threshold discharge limit and lower threshold limits may be the substantially the same value, such as within about 5% of each other. A threshold charge limit may be a state of charge value that is less than an upper threshold limit and may allow charging of the battery unit to the upper threshold limit before the microprocessor opens the relay. A threshold discharge limit may be a state of charge that is above a lower threshold limit and may allow discharging to a lower threshold limit before the microprocessor opens the relay.

In an exemplary embodiment, a battery management system, comprises a program to determine the state of charge of a battery unit or battery, or the amount of available charge remaining. The calculation takes into account the battery unit or pack voltage prior to the utilization of battery power as the output power. The program utilizes input related to the power being drawn by the powered device, such as current, voltage and time, and calculates the total power usurped from the battery pack. The program can then calculate the discharge percent of the battery pack, as depicted in FIG. 19. A power control system may calculate the time remaining before the battery pack is discharged 80% and may send an alert via a data transmission system of the remaining time before shut-down. A power control system may shut-down the battery pack if a discharge level of 80% or more is reached, for example, in an effort to protect the system and prevent damage to the battery pack.

An exemplary battery management system includes a battery unit monitoring module that is utilized for obtaining data about battery units in a battery pack. A computing device can obtain the data by sending a data request to the first monitoring module. The first monitoring module obtains and transmits data about its connected battery unit to the computing device and sends a data request to the second monitoring module. The second monitoring module obtains and transmits data about its connected battery to the computing device and sends a data request to the next monitoring module. Each successive monitoring module performs the same steps until all the monitoring modules have sent data about their connected battery units to the computing device. Thus, the computing device needs solely a data request port and input data port(s) to obtain the data for a battery pack.

In one aspect, the present disclosure describes a battery management system. The battery management system includes a computing device with an output data request port and an input data port. The battery management system also includes first and second battery unit monitoring modules, each battery unit monitoring module connected to the input data port of the computing device. In response to a data request from the output data request port of the computing device, the first battery unit monitoring module transmits data of the first battery unit to the input data port of the computing device, and transmits a data request to the second battery unit monitoring module. In response to the data request from the first battery unit monitoring module, the second battery unit monitoring module transmits data of the second battery unit to the input data port of the computing device.

The first battery unit monitoring module can connect to a first battery unit in a battery pack of an electric vehicle. The battery management system can also include wiring connecting the computing device to the battery unit monitoring modules. Because the battery units in a battery pack can be wired in series, the physical locations of the positive and negative terminals arranged in an alternating fashion, the second battery unit monitoring module is oriented in an opposite direction from the first battery unit monitoring module.

The first battery unit monitoring module can include an analog-to-digital converter. The analog-to-digital converter can measure a voltage of the first battery unit. The first battery unit monitoring module can include a temperature monitoring device that measures a temperature of the first battery unit. The temperature can be expressed as a voltage which is applied to an input of the analog-to-digital converter. Data of the first battery unit can be a voltage and a temperature of the first battery unit. Data of the second battery unit can be a voltage and a temperature of the second battery unit.

The computing device can scan the first and second battery unit monitoring modules to determine a number of battery unit monitoring modules in the battery management system. The computing device can transmit a second data request to the first battery unit monitoring module after the computing device has not received data on the input data port for a predetermined period of time. The predetermined period of time may be 20 ms. The computing device can include an analog-to-digital convertor that measures a voltage across the first and second battery units. The computing device can include an analog-to-digital convertor that measures a current flowing in the first and second battery units.

The computing device can output an alarm when an error condition is detected. The error condition can be a high voltage condition, a low voltage condition, a high current condition, a high temperature condition, or a connection fault condition. The computing device can shut off a battery charger when the computing device detects a high voltage condition across the first and second battery units. The computing device can shut off a motor controller when the computing device detects a low voltage condition across the first and second battery units.

The battery management system can include a monitor, such as a video monitor, that displays the data of the first and second battery units. The battery management system can include a connection fault detector that detects a connection between a node at a zero-voltage reference level and the first and second battery units. The battery management system can include one or more battery unit balancing systems, each system balancing charge in a battery unit.

In another aspect, the present disclosure describes a battery management system with a computing device and first and second battery unit monitoring modules. The computing device includes a first output data request port and an input data port. The first battery unit monitoring module includes a first input data request port connected to the output data request port of the controller, a first output data port connected to the input data port of the controller, and a second output data request port. The second battery unit monitoring module includes a second input data request port connected to the second output data request port of the first battery unit monitoring module, and a second output data port connected to the input data port of the controller.

In another aspect, the present disclosure describes a method of managing a battery. The method includes transmitting, by a computing device, a first data request to a first battery unit monitoring module. The method also includes transmitting, by the first battery unit monitoring module, data of a first battery unit to an input data port of the computing device in response to the first data request. The method also includes transmitting, by the first battery unit monitoring module, a second data request to a second battery unit monitoring module. The method also includes transmitting, by the second battery unit monitoring module, data of a second battery unit to the input data port of the computing device in response to the second data request.

The entirety of the following patents are incorporated by reference herein: U.S. Pat. No. 8,723,482 issued on May 13, 2014 and entitled Battery Unit Balancing System; U.S. Pat. No. 9,595,847, issued on Mar. 14, 2017 and entitled Uninterrupted Lithium Battery Power Supply System; U.S. Pat. No. 9,371,067, issued on Jun. 21, 2016 and entitled Integrated Battery Control System; and U.S. Pat. No. 9,553,460, issued on Jan. 24, 2017 and entitled Wireless Battery Management System; all are assigned to Elite Power Solutions LLC.

The summary of the invention is provided as a general introduction to some of the embodiments of the invention, and is not intended to be limiting. Additional example embodiments including variations and alternative configurations of the invention are provided herein.

BRIEF DESCRIPTION OF SEVERAL VIEWS THE DRAWINGS

The accompanying drawings are included to provide a further understanding of the invention and are incorporated in and constitute a part of this specification, illustrate embodiments of the invention, and together with the description serve to explain the principles of the invention.

Figure 1:
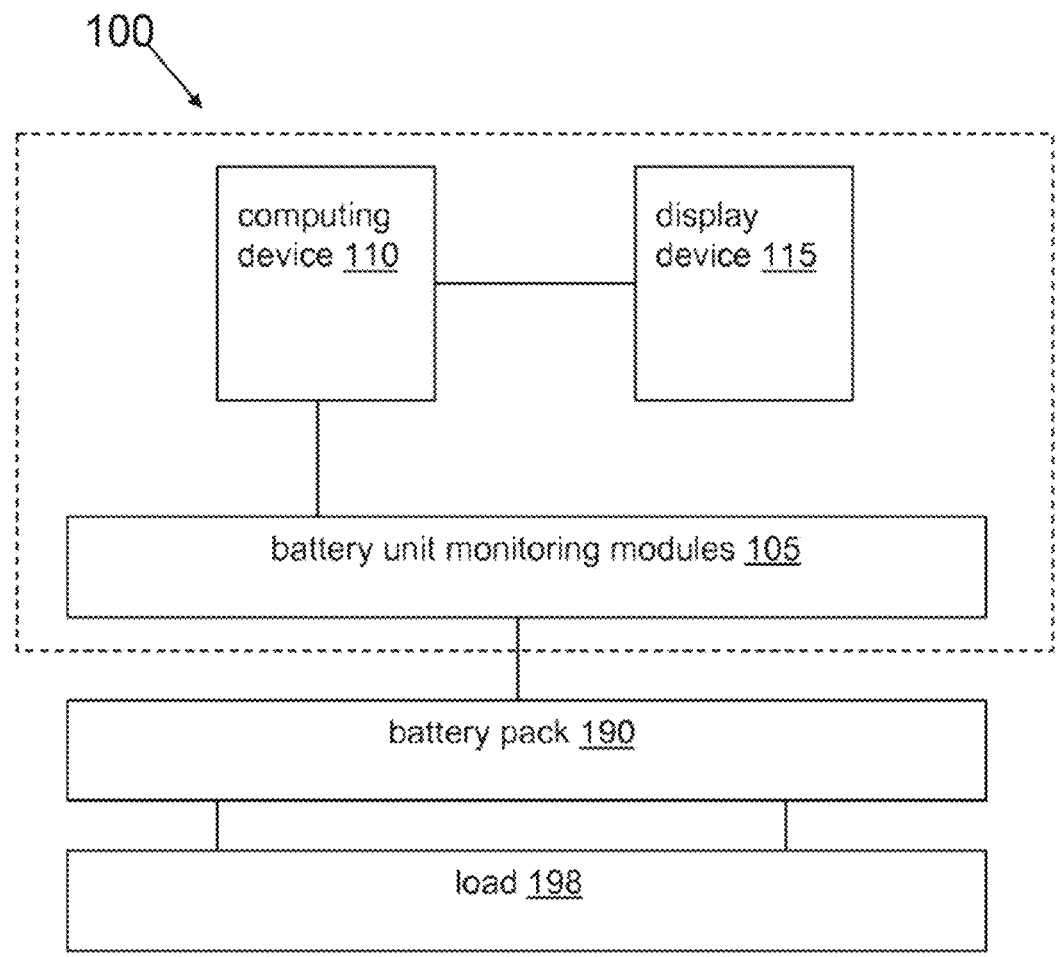
FIG. 1 is a block diagram depicting an exemplary embodiment of a battery management system connected to a battery pack.

Corresponding reference characters indicate corresponding parts throughout the several views of the figures. The figures represent an illustration of some of the embodiments of the present invention and are not to be construed as limiting the scope of the invention in any manner. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

DETAILED DESCRIPTION OF THE ILLUSTRATED EMBODIMENTS

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Certain exemplary embodiments of the present invention are described herein and are illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

The present disclosure describes, among other things, certain embodiments of a battery management system. The management system obtains and displays data about battery units in a battery pack. The management system can monitor the voltage and temperature of the individual battery units and/or the entire battery pack. If the management system discovers any of the battery units pose a concern (e.g., the voltage is over or under limits, or the battery unit is overheating), the system can take measures to prevent damage to itself or the battery pack or to alleviate the concern. The system can also take comparable measures if the system detects a connection between any of the battery units and ground. Thus, the battery management system can maintain the consistent operation of the system the battery pack powers, such as an electric vehicle.

Referring now to FIG. 1, a block diagram of an exemplary embodiment of a battery management system 100 connected to a battery pack 190 is shown and described. The battery management system 100 includes battery unit monitoring modules 105 (e.g., sense boards), a computing device 110, and a display 115 (e.g. a monitor such as an LCD monitor or a monitor incorporated into another device, such as a DVD player). The computing device 110 can measure voltage and/or current for the entire battery pack 190 and output the data to the display 115. In various embodiments, the computing device 110 can determine the state of charge of the battery pack 190 by measuring the amount of current that flows in or out of the battery pack 190. The battery pack 190 can integrate the amount of current to determine the state of charge. In some embodiments, when the battery pack 190 reaches a minimum, predetermined voltage, the computing device 110 can set the pack's 190 state of charge to about 0%. When the battery pack 190 reaches a maximum, predetermined voltage, the computing device 110 can set the state of charge to about 100%.

In some embodiments, the battery pack 190 may include a plurality of battery units 195 (e.g., battery cells). Each battery unit may include a battery cell or a plurality of battery cells. The battery pack 190 can connect to an external load 198, such as a motor for an electric vehicle. Each battery unit monitoring modules 105 of the management system 100 can connect to a battery unit 195. A monitoring module 105 can obtain data, such as voltage and/or temperature, for the battery unit 195 connected to the module 105. The monitoring modules 105 can transmit the data to the computing device 110, which can output the data to the display 115.

In some embodiments, the computing device 110 may be configured to operate with a predetermined, fixed number of battery unit monitoring modules 105. In some embodiments, the computing device 110 may be configured to scan the modules 105 to determine the number of modules 105 present. The computing device 110 can scan the battery unit monitoring modules 105 to determine the number of monitoring modules 105 in the system 100. For example, in some embodiments, the computing device 110 can output a scan signal to the first monitoring module 105. In response, the monitoring module 105 can return battery unit voltage and temperature data to the computing device 110 and can output a scan signal to a successive monitoring module 105. In some embodiments, the monitoring module 105 can also return battery unit voltage and temperature data to the computing device 110, and can output a scan signal to the next module 105. Thus, the computing device 110 can count the number of monitoring modules 105 by the number of voltage and temperature data packets received. Further, the computing device 110 can number a monitoring module 105 and/or battery unit 195 based on the module's 105 or unit's 195 position in the order of scan signals received. In some embodiments, a user can configure the computing device 110 to set the number of monitoring modules 105 or to instruct the device 110 to scan the modules 105 and obtain the number of modules itself.

The computing device 110 can detect error conditions for individual battery units 195 and/or the entire battery pack 190. Exemplary error conditions can include conditions such as high voltage conditions, low voltage conditions, high current conditions, and high temperature condition. Another exemplary error can be a connection fault condition, e.g., a connection between at least one battery unit 195 and a contact point with a zero-voltage reference level, such as a chassis of an electric vehicle.

When an error is detected, the computing device 110 can initiate a measure based on the error condition. For example, if the computing device 110 detects a high voltage condition for the entire battery pack 190, the computing device 110 can inactivate a device that charges the pack 190 (not shown). In another example, if the computing device 110 detects a first low voltage condition, the computing device 110 can output a low voltage warning to the display 115. If the battery pack's 190 voltage drops further, triggering a second low voltage condition, the device 110 can inactivate a load connected to the battery pack 190, such as a motor controller of an electric vehicle.

Figure 2:
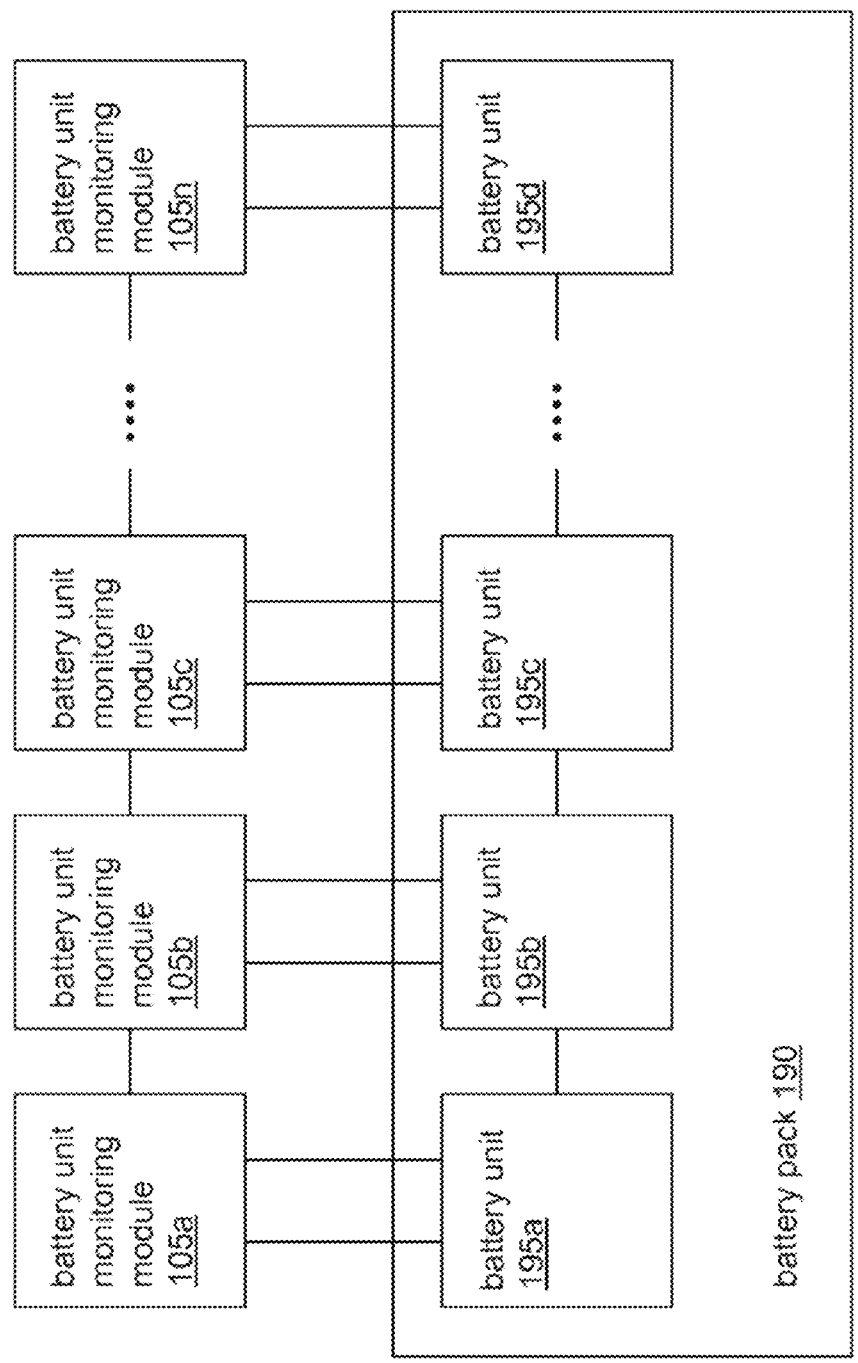
FIG. 2 is a block diagram depicting an exemplary arrangement of battery unit monitoring modules of the battery management system with respect to the battery units of the battery pack.

Referring now to FIG. 2, a block diagram of an exemplary arrangement of battery unit monitoring modules 105 and battery units 195 in a pack 190 is shown and described. In this embodiment, the monitoring modules 105 are connected to the battery units 195, which are connected in series. Each monitoring module 105 can be connected to a single battery unit 195. The battery unit 195 can supply the connected monitoring module 105 with power for performing its operations.

Figure 3:
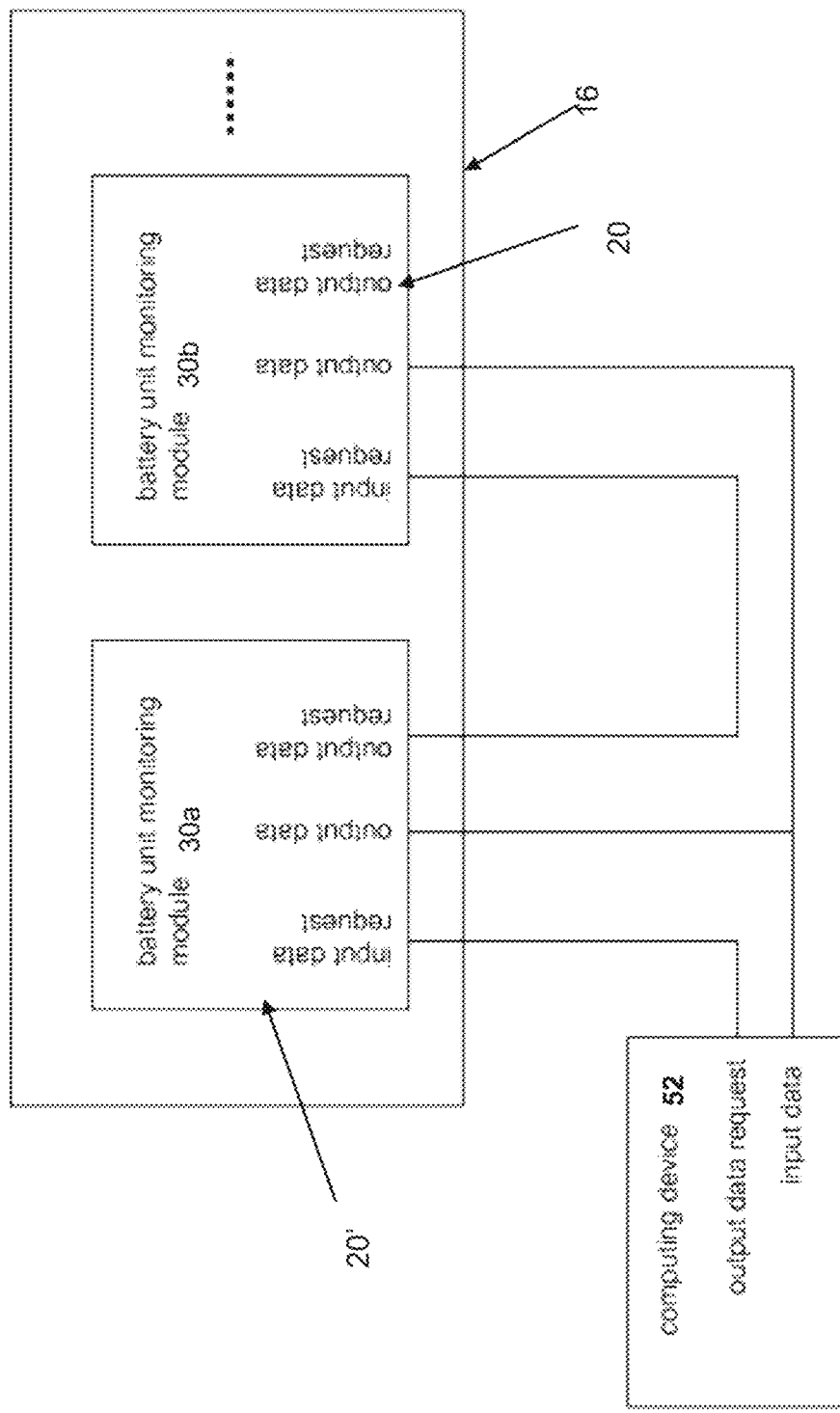
FIG. 3 is a block diagram depicting connections within the battery management system between the computing device and the battery unit monitoring modules.

FIG. 3 is a block diagram depicting connections within the battery management system 100 between the computing device 110 and the battery unit monitoring modules 105. The computing device 110 includes an output data request port (also referred to herein as an "enable output") and an input data port. Each monitoring module 105 includes an output data port, an input data request port (also referred to herein as an "enable input"), and an output data request port. Each monitoring module's 105 output data port is connected in parallel to the computing device's 110 input data port.

The computing device's 110 output data request port is connected to the first one of the battery unit monitoring module's 105a input data request port. The monitoring module's 105a output data request port is connected to the input data request port of the successive monitoring module 105b. In turn, the monitoring module's 105b output data request is connected to the input data request port of the next monitoring module 105c. The remaining monitoring modules 105 are connected in the same manner. The communications of the computing device 110 and battery unit monitoring modules 105 described herein are transmitted from and received at these ports, as would be understood by one of ordinary skill in the art. Further, in various embodiments, the computing device 110 and monitoring modules 105 include voltage and ground connections such that the computing device 110 can provide power (e.g., 12V) and ground to the monitoring modules 105.

In operation, to obtain data about the battery units 195, the computing device 110 sends a data request signal (also referred to herein as an "enable signal" or an "enable pulse") to the first battery unit monitoring module 105a. In response, the monitoring module 105a transmits data about a connected battery unit 195a to the computing device 110. After the module 105a finishes transmitting data, the module 105a sends a data request signal to the second battery unit monitoring module 105b. In response, the monitoring module 105b transmits data about a connected battery unit 195b to the computing device 110. After the module 105b finishes transmitting data, the module 105b sends a data request signal to the third battery unit monitoring module 105c, and the process continues for the rest of the monitoring modules 105.

Using this communication system, the computing device 110 can match data with a battery unit according to the order in which the device 110 receives data. Thus, the first set of data can be matched to the first battery unit 195a, the second set of data to the second unit 195b, and so forth. In this manner, the computing device 110 uses few ports for obtaining data and matching the data to battery units 195. In some embodiments, such a battery management system 100 may eliminate the needs for dedicated addressing ports, addressing switches, and/or jumpers.

When the computing device 110 does not receive data from a battery unit 195 for at least a predetermined period of time (e.g., 20 ms, although other times may be used), the computing device 110 can conclude that data collection for the battery pack 190 has been completed. The computing device 110 can obtain another set of data by transmitting another data request to the first battery unit monitoring module 105a, thereby restarting the data collection process. In some embodiments, the computing device 110 can collect data about the battery units 195, e.g., once per 1-2 seconds.

In some embodiments, the computing device 110 can first compare the number of data received with the number of monitoring modules 105. If the numbers match, the computing device 110 can determine all the monitoring modules 105 are operational and continue obtaining data about the battery units 195. If the numbers do not match, the computing device 110 can conclude that at least one monitoring module 105 and/or battery unit 195 is not operational. The computing device 110 can generate and output an error message to the display 115. Since the modules 105 transmit data to the computing device 110 in sequential order, the computing device 110 can identify the non-operational module 105 or unit 195 according to the number of data received. In this manner, the computing device 110 can inform a user of physical locations of faults in the monitoring modules 105 or battery pack 190, allowing the user to troubleshoot problems.

Regarding the individual monitoring modules 105, in some embodiments, a module 105 can measure data for a connected battery unit 195 upon receiving a data request signal. In some embodiments, a module 105 can measure and store data in a buffer. Then, when the module 105 receives the data request signal, the module 105 may access the buffer and may transfer the data stored therein to the computing device 110.

The monitoring module 105 can transmit the data to the computing device 110 in a human readable form. The monitoring modules 105 can transmit the data via an asynchronous serial protocol, such as protocols used for RS-232 or USB connections. The monitoring modules 105 can transmit the data at any rate and with any number of start and/or stop bits. For example, a module 105 can transmit at 9600 Baud with 1 start bit and 1 stop bit.

Figure 4:
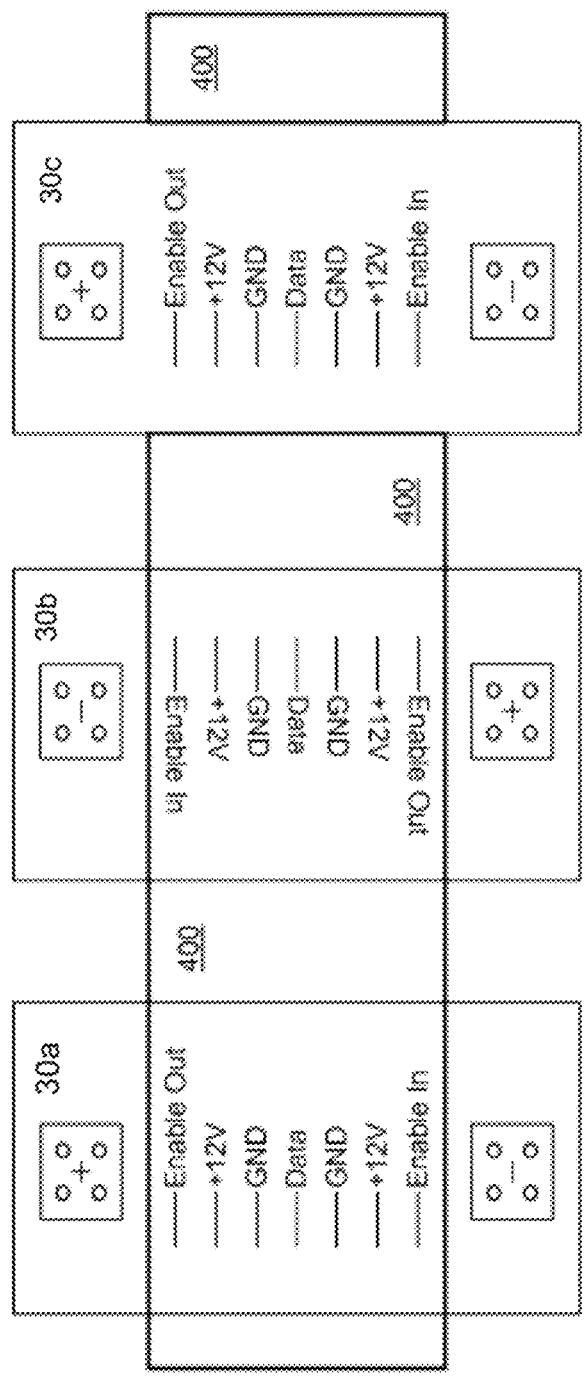
FIG. 4 is a diagram depicting connections between battery unit monitoring modules.

Referring now to FIG. 4, a diagram depicting connections between battery unit monitoring modules 105 is shown and described. In some embodiments, wiring 400 (e.g., ribbon cable, 4-wire round shape harnesses) can be used to connect the monitoring modules 105 to one another. In some embodiments, for each monitoring module 105, the output data port can be located in the center of a module's 105 interface. In some embodiments, the input data request port and the output data request port can be symmetrically located on opposite sides of the output data port. By orienting each battery unit monitoring module 105 in an opposite direction from adjacent modules 105, wiring 400 can connect the output data request port of one module 105 to the input data request port of the successive module 105. Due to the orientation of the ports, the wiring 400 need not be twisted or folded. Further, the wiring 400 can connect all the output data ports to the input data port of the computing device 110. When a monitoring module 105 transmits data for its connected battery unit 195, the data can be sent across each portion of wiring 400 connecting the monitoring modules 105 before the data arrives at the computing device 110.

Figure 5:
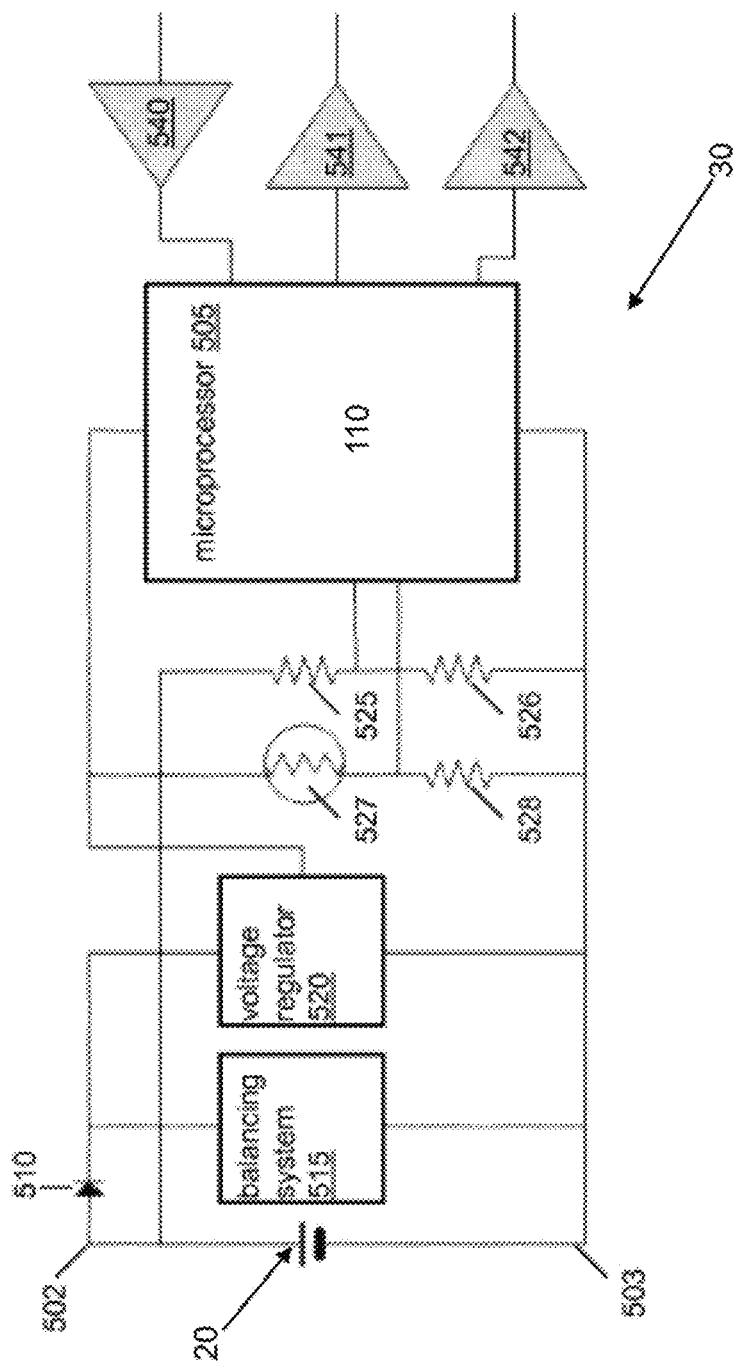
FIG. 5 is a hybrid block and circuit diagram depicting an exemplary battery unit monitoring module.

FIG. 5 is a hybrid block and circuit diagram depicting an exemplary battery unit monitoring module 105. The monitoring module 105 includes terminals 502 and 503, a microprocessor 505, a reverse connection protection system 510, a battery unit balancing system 515, a voltage regulator 520, resistors 525, 526 for sampling a battery unit's 195 voltage, and a temperature monitoring device 527 (e.g., a thermistor) for sampling a battery unit's 195 temperature. The monitoring module 105 also includes a receiver 540 for receiving a data request signal from a computing device 110 or monitoring module 105, a driver 541 for transmitting data of the connected battery unit 195 to the computing device 110, and a driver 542 for transmitting a data request signal to another monitoring module 105.

A battery unit 195 connects to the monitoring module 105 at terminals 502 and 503. Thus, the battery unit 195 applies its voltage to the reverse connection protection system 510. If the voltage is sufficiently high, the protection system 510 conducts and applies the voltage to the voltage regulator 520, resistors 525, 526, temperature monitoring device 527, and balancer 515. If the battery unit 195 is improperly connected to the terminals 502, 503 (e.g., with incorrect polarity), the reverse connection protection system 510 does not conduct, thereby protecting the module 105 from potentially damaging voltages.

When the protection system 510 conducts, the voltage regulator 520 can draw upon the battery unit's 195 voltage to supply a stable voltage (e.g., 2V) for the monitoring module 105. In particular, this voltage can power the microprocessor 505. The microprocessor 505 can obtain the battery unit's 195 voltage via resistors 525 and 526 and/or the temperature via temperature monitoring device 527. In some embodiments, the microprocessor 505 can sample the values on the resistors 525, 526 and temperature monitoring device 527 to obtain the voltage and temperature. The microprocessor 505 can store the values in an internal memory.

In some embodiments, when the receiver 540 receives a data request signal, the receiver 540 transmits the signal to the microprocessor 505. In response, the microprocessor 505 obtains the voltage and temperature of the battery unit 195, either by measuring the values on the resistors 525, 526 and temperature monitoring device 527 or by accessing stored values in an internal memory. The microprocessor 505 transmits the values to the driver 541, which drives the values back to the computing device 110 via, for example, asynchronous serial ASCII communication. At substantially the same time, the microprocessor 505 can generate and output a data request signal to the driver 542. The driver 542 drives the data request signal to the next monitoring module 105 for obtaining data about its connected battery unit 195.

Figure 6:
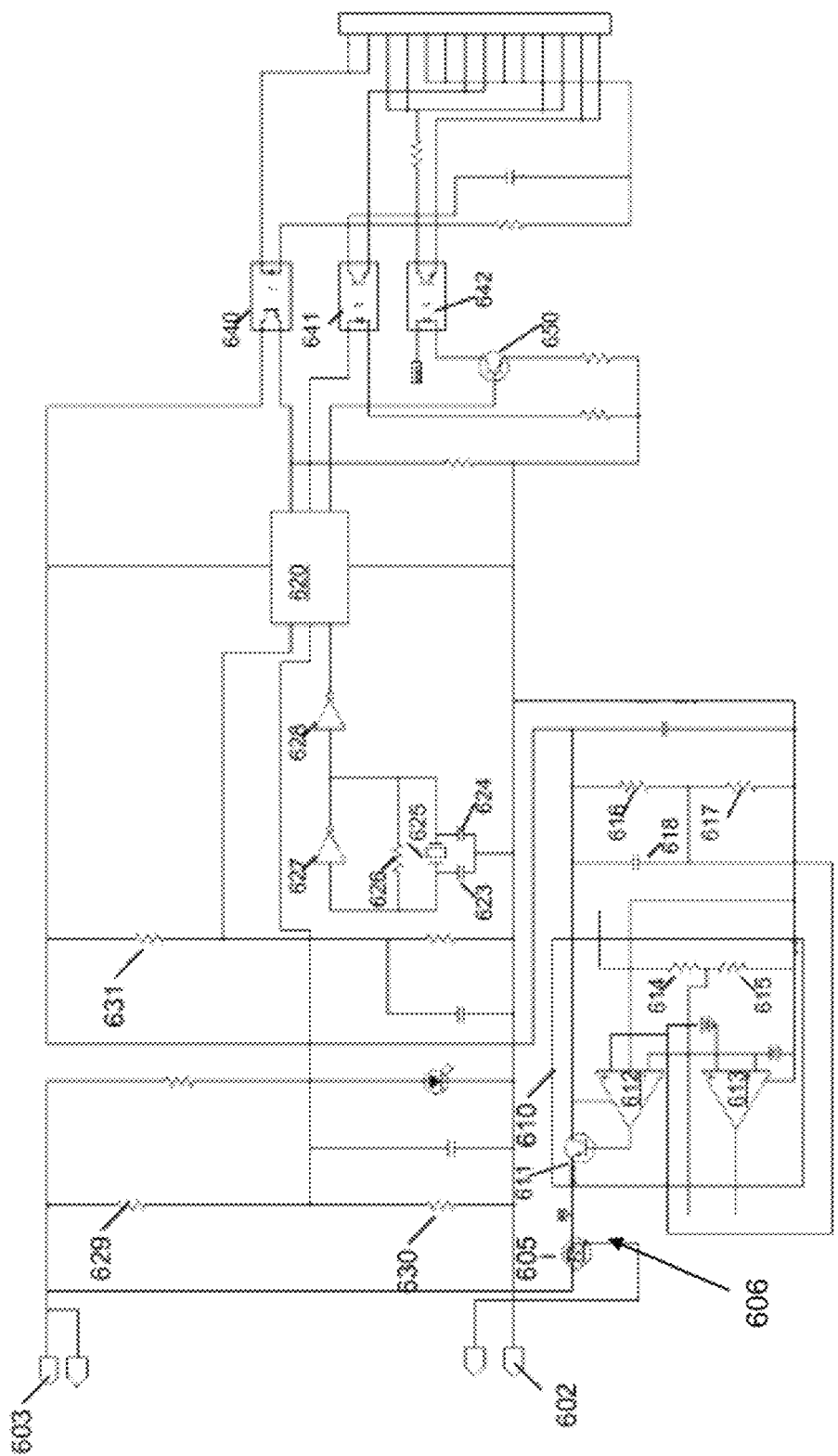
FIG. 6 is a circuit diagram of an exemplary embodiment of a battery unit monitoring module.

Referring now to FIG. 6, a circuit diagram of an exemplary embodiment of a battery unit monitoring module 105 is shown and described. In this embodiment, the terminals 602, 603 correspond to the terminals 502, 503 of FIG. 5. The protection system 510 can be a metal-oxide-semiconductor field effect transistor (MOSFET) 605, such as a p-type MOSFET. Terminals of the battery unit 195 can connect to both the source and base of the MOSFET 605. When the battery unit's 195 voltage is sufficiently high, the voltage activates the MOSFET 605. As the MOSFET 605 conducts, the battery unit 195 applies its voltage to the voltage regulator 610. If the battery unit's 195 voltage is insufficiently high, or its polarity is reversed, the MOSFET 605 does not conduct, thereby protecting the module 105 from potentially damaging voltages. In this manner, the MOSFET 605 can operate as a low voltage drop diode.

The voltage regulator 610 can be an integrated circuit (e.g., a LP2951) which can use a transistor 611, two operational amplifiers 612, 613, and two resistors 614, 615 to regulate a voltage. Resistors 616, 617 can divide the output of the voltage regulator 610 to, for example, 2V. The divided voltage can be fed back to the error amplifier 612, and the regulator 610 can adjust the output accordingly. In this manner, the voltage regulator 610 can output a substantially constant voltage. The capacitor 618 can fitter the divided voltage before supplying the voltage to a microprocessor 620. Further, a power supply can power a clock generator (with capacitors 623, 624, an oscillator 625, resistor 626, and buffers 627, 628) to generate a clock signal. The clock signal can be provided to the microprocessor 620 for its operations.

The battery unit 195 can connect, via the terminals 602, 603, to resistors 629, 630 and a thermistor 631. A node between the resistors 629, 630 and a node adjacent to the thermistor 631 can connect to input ports of the microprocessor 620, which in turn can connect to an internal analog-to-digital converter (also referred to herein as A/D converter). One of the inputs to the internal A/D converter can sample the voltage between the resistors 629, 630 to determine the voltage of the battery unit 195. Another input to the internal A/D converter can sample the temperature of the battery unit 195, expressed as a voltage, via the thermistor 631. The microprocessor 620 can store the voltage and temperature in an internal memory. In some embodiments, the microprocessor 620 connects to separate A/D converters that sample the voltage and temperature.

The microprocessor 620 can receive a data request signal via the receiver 640 (e.g., an optocoupler). In response, the microprocessor 620 can obtain the voltage and temperature of the battery unit 195 and transmit the values to the driver 641, which drives the values back to the computing device 110. At substantially the same time, the microprocessor 620 can generate and output a data request signal. The data request signal can conned to the base of a transistor 650. When the signal turns on the transistor, current flows through the driver 642 to output another data request signal to the next monitoring module 105.

Figure 7:
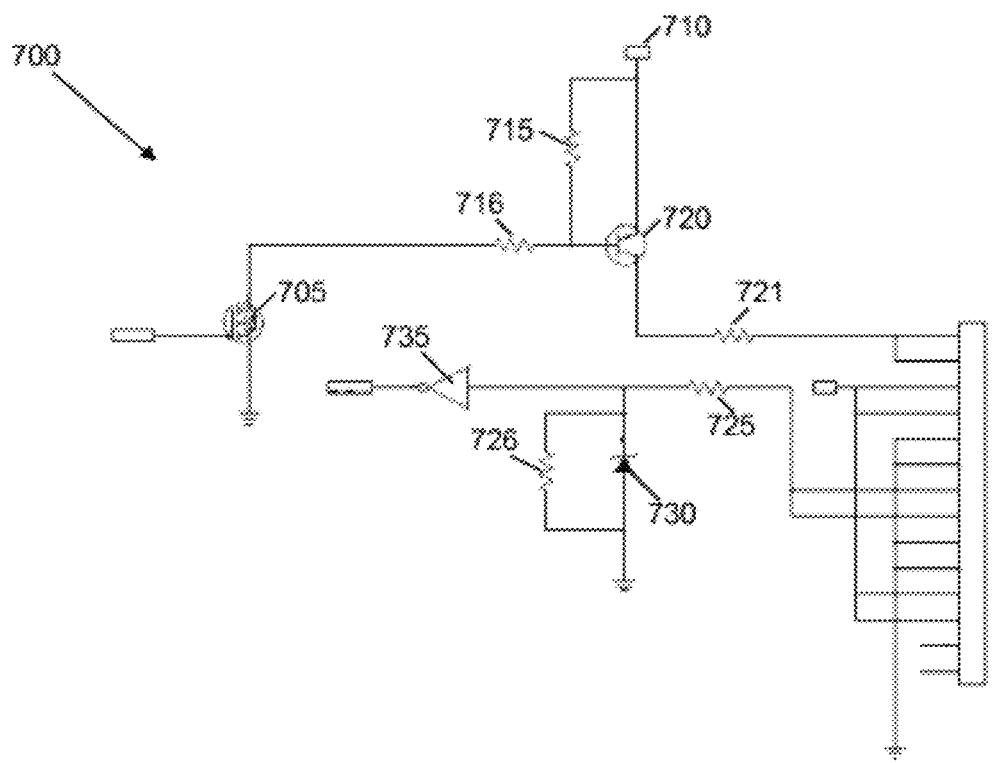
FIG. 7 is a circuit diagram of an exemplary embodiment of the interface for a computing device.

FIG. 7 is a circuit diagram of an exemplary embodiment of an interface 700 for the computing device 110. The interface 700 can be used by the computing device 110 for communicating with to battery unit monitoring modules 105. The computing device 110 can apply a data request signal to the gate of a transistor 705, such as a metal-oxide-semiconductor field-effect transistor (MOSFET). In response, the transistor 705 conducts and current flows from the voltage source 710 through the resistors 715, 716. The voltage that develops at the node between the resistors 715, 716 activates the transistor 720. As a result, current flows from the voltage source 710 through the transistor 720 and resistor 721 to output a data request signal (e.g., a logic high signal) for the first battery unit monitoring module 105.

The circuit can receive a data signal (e.g., as 12V signal) through the TX pins on a connector. Resistors 725, 726 can divide the data signal, and the Zener diode 730 can clamp the data signal to a voltage substantially equal to the voltage supplied to the battery unit monitoring module's microprocessor (e.g., 3.3V). An inverter 735, such as a Schmitt Trigger inverter, can eliminate noise and sharpen the rise and fall times of the divided and/or clamped data signal before passing the data signal to the microprocessor of the computing device 110.

In various embodiments, the interface 700 can be located on the same board as the other components of the computing device 110. In some embodiments, the communication interface can be isolated from those other components.

Figure 8:
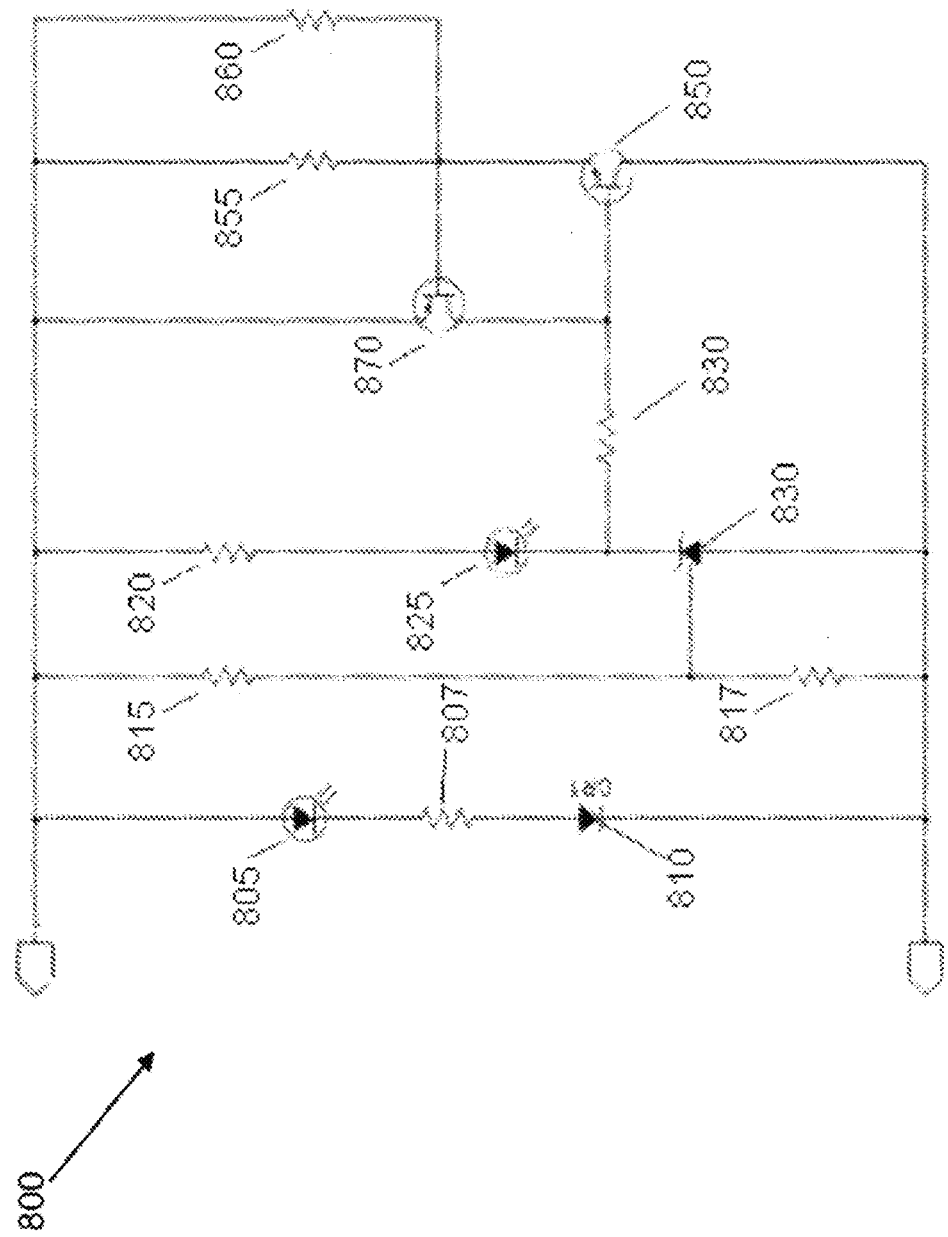
FIG. 8 is a circuit diagram of an exemplary embodiment of a battery unit balancing system in a battery unit monitoring module.

FIG. 8 is a circuit diagram of an exemplary embodiment of a balancing unit 800 of a battery unit monitoring module 105. The operation of the balancing unit is described in U.S. application Ser. No. 12/939,889, entitled "Battery Unit Balancing System," filed Nov. 4, 2010, the contents of which are hereby incorporated by reference in their entirety.

Figure 9:
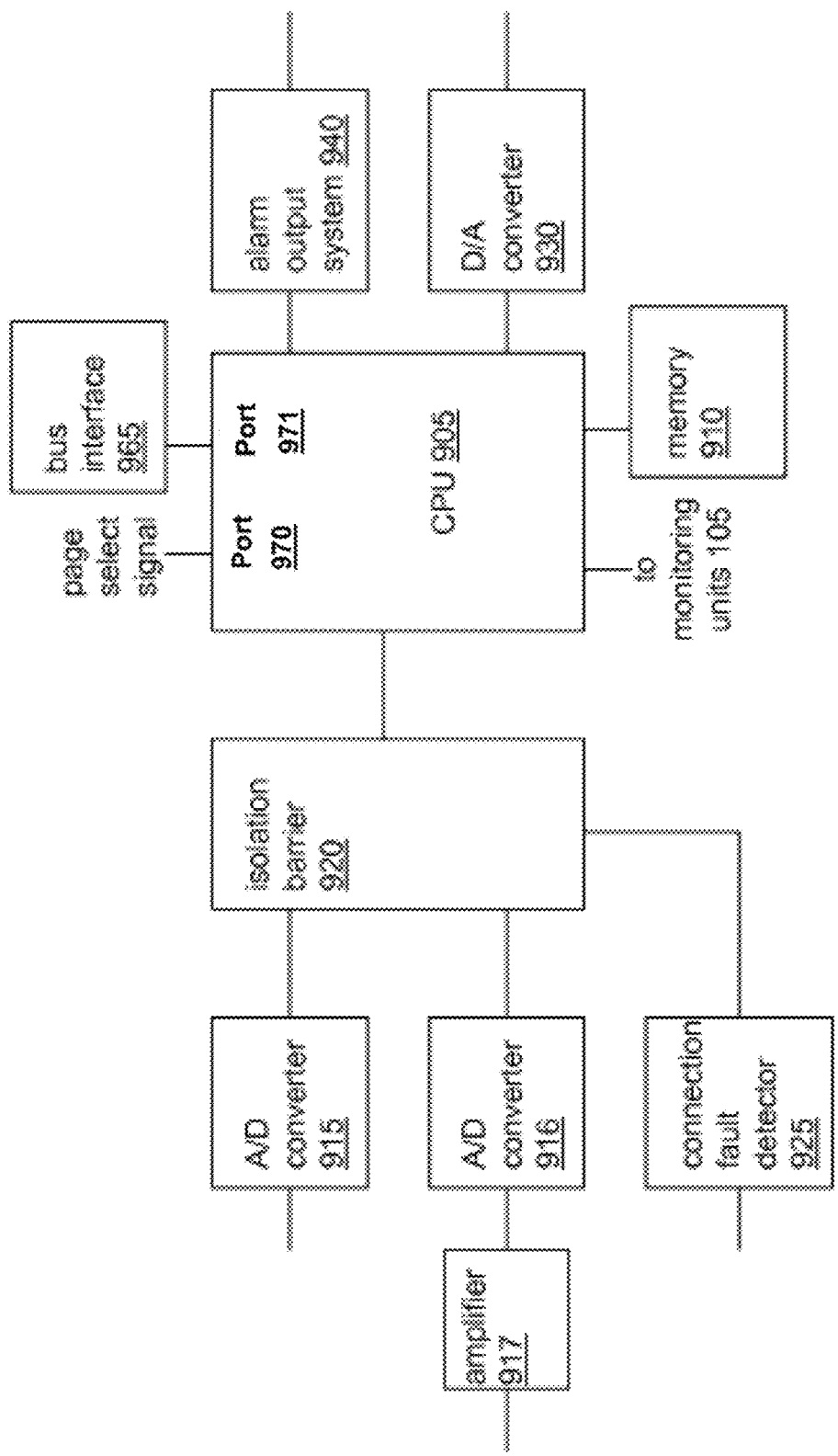
FIG. 9 is a block diagram depicting an exemplary embodiment of the computing device of the battery management system.

FIG. 9 is a block diagram depicting an exemplary embodiment of the computing device 110 of the battery management system 100. The computing device 110 can include a central processing unit (CPU, e.g. 8-core processor) 905 and a memory 910 (e.g., electrically erasable programmable read-only memory, or EEPROM serial memory) that stores a program with executable instructions. The program can be loaded into the memory 910 from an external device connected via, for example, the bus interface 965 or a USB cable. The CPU 905 can load and execute instructions from the memory 910 to perform its operations. The program may include configuration data, such as the predetermined number of battery unit monitoring modules 105 in the system 100 or the threshold battery unit voltage or temperature that would trigger an error condition. In some embodiments, the program may obtain the configuration data from values input by a user of the system 100.

The computing device 110 can use an analog-to-digital (A/D) converter 915 to measure the voltage of the battery pack 190. The A/D converter 915 can sample the voltage to obtain a value. The computing device 110 can use an analog-to-digital (A/D) converter 916 to measure the current of the battery pack 190. In some embodiments, the A/D converter 916 is connected to a shunt, which in turn is connected to a terminal of the battery pack 190 and a terminal of the external load 198. The shunt can be a resistor that develops a voltage drop proportional to the battery pack's 190 current (e.g., 0.0001 Ohms developing a voltage drop of 0.1 mV/A). An amplifier 917 can amplify the value of the current before the A/D converter 916 samples the current. The A/D converters 915, 916 can direct the battery pack voltage and current to an isolation barrier 920 controlled by a signal from a connection fault detector 925. In some embodiments, the A/D converters 915, 916 are on the same board as the CPU 905, isolated, and/or both.

The connection fault detector 925 can signal the presence of a connection between a battery unit 195 and a zero-voltage reference level. For example, the zero-voltage reference level can be the battery pack's 190 enclosure or chassis, and the connection between a battery unit 195 and the chassis would represent a hazard to service personnel. When one or more battery units 195 within the battery pack 190 contacts a point at the zero-voltage reference level, the contact can cause current to flow from the battery unit 195. The connection fault detector 925 detects the connection and outputs a signal to the CPU 905 which will display a warning indicating this connection on the display device 115.

The CPU 905 can connect to the battery unit monitoring modules 105 to obtain data about the individual battery units 195, as described in reference to FIGS. 3-5. The CPU 905 can process data about the individual battery units 195 and/or battery pack 190 to create a composite video signal. A digital-to-analog (D/A) converter 930 (e.g., a 3-bit converter) can produce the composite video signal from digital to analog format so the signal can be displayed on a display 115.

If the CPU 905 detects an error condition, the CPU 905 can transmit an error signal to an alarm output system 940. The system 940 can be used to control a component and/or device that responds to the error signal (e.g., a charger that stops charging the battery pack 190, or a motor controller of an electric vehicle that stops discharging the battery).

The computing device 110 can include power supplies 960 (not shown on FIG. 9). The power supplies 960 supply voltages to components of the battery management system 100. In some embodiments, a power supply 960 can include an internal voltage regulator to provide a constant voltage. The power supplies 960 can be isolated from the other components of the computing device 110 to prevent damage to the device 110.

The computing device 110 can include an interface 965, such as a controller area network (CAN) interface. The interface can include ports, such as parallel port pins. The computing device 110 can connect to external devices via an interface (not shown). For example, the device 110 can connect to another computing device to receive a program to be stored in the memory 910.

The computing device 110 can include a port 970 for receiving a page select signal. A page can correspond to a format for displaying data about a battery unit 195 within the battery pack 190. For example, one page can display the data for the entire pack 190. Another page can display the voltages and temperatures of eight, twenty, or any other number of battery units 195. Successive pages can display the same information for adjacent sets of battery units 195. The computing device 110 can receive the page select signal from a switch mounted in a dashboard in an electric vehicle, for example (not shown). In response, the computing device 110 can output the selected page containing battery pack data to the display 115.

Figure 10:
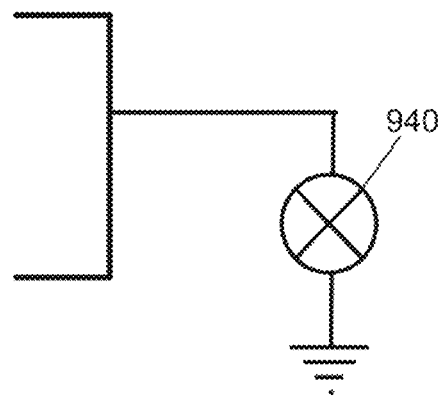
FIG. 10 is a block diagram depicting an exemplary embodiment of the alarm output system of the computing device.
Figure 10:
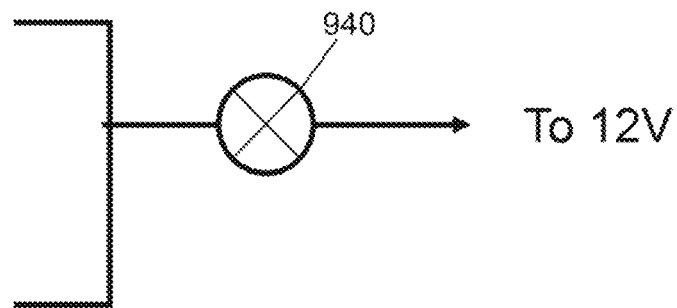

FIG. 10 is a block diagram depicting an exemplary embodiment of the alarm output system 940 of the computing device 110. The alarm output system 940 receives an error signal from the computing device 110. The alarm output system 940 outputs a binary signal according to the error signal. If the error signal corresponds to an off signal, the system 940 allows current to flow to a ground reference, thereby outputting a logic low signal (e.g., 0V). If the error signal corresponds to an on signal, the system 940 allows current to flow from a voltage source, such as 12V. In some embodiments, the system 940 does not allow current to flow until the error signal lasts at least 30 seconds. In this manner, the system 940 turns on or off external devices according to the presence of an error.

Figure 11:
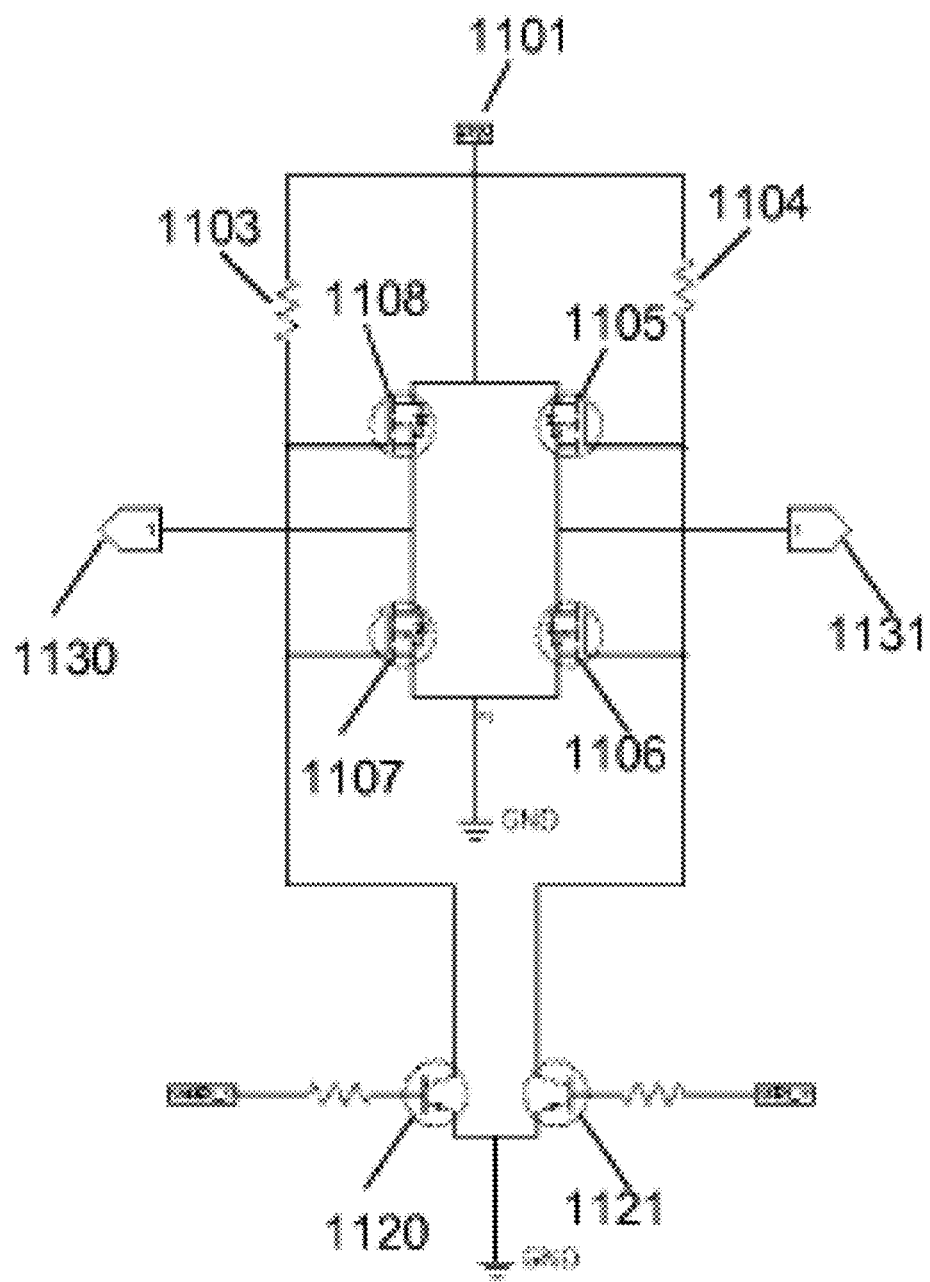
FIG. 11 is a circuit diagram depicting an exemplary embodiment of the alarm output system of the computing device.

FIG. 11 is a circuit diagram depicting an exemplary embodiment of the alarm output system 940 of the computing device 110. The alarm output system 940 includes a voltage source 1101, two resistors 1103, 1104, four transistors (e.g., metal-oxide-semiconductor field-effect transistors or MOSFETs) 1105, 1106, 1107, 1108 configured to form an H bridge, and two transistors 1120, 1121 that operate the alarm output system 940. Transistors 1105, 1108 can be of opposite polarity from transistors 1106, 1107. The alarm output system 940 can apply one or more received error signals to the transistors 1120, 1121 and output one or more command signals corresponding to the error signals at terminals 1130, 1131.

In operation, an error signal can be applied to transistor 1120 and/or transistor 1121. If the computing device 110 detects a low voltage condition, the device 110 can apply an error signal to transistor 1120. As transistor 1120 conducts, the voltage applied to the gates of transistors 1107, 1108 by the voltage source 1101 drops. The voltage differential between the source and gate of transistor 1107 decreases to turn the transistor 1107 off. The voltage differential between the source and gate of transistor 1108 increases to turn the transistor 1108 on. As transistor 1108 conducts, current flows from the voltage source 1101 through the transistor 1108 to the output terminal 1130. The voltage that develops on the output terminal 1130 can be used to shut off a motor controller, by way of example.

If the computing device 110 detects a high voltage condition, a high current condition, or a high temperature condition, the device 110 can apply an error signal to transistor 1121. As transistor 1121 conducts, the voltage applied to the gates of transistors 1105, 1106 by the voltage source 1101 drops. The voltage differential between the source and gate of transistor 1106 decreases to turn the transistor 1107 off. The voltage differential between the source and gate of transistor 1108 increases to turn the transistor 1105 on. As transistor 1105 conducts, current flows from the voltage source 1101 through the transistor 1105 to the output terminal 1131. The voltage that develops on the output terminal 1130 can be used to shut off a battery charger or turn on a fan, by way of example.

Figure 12:
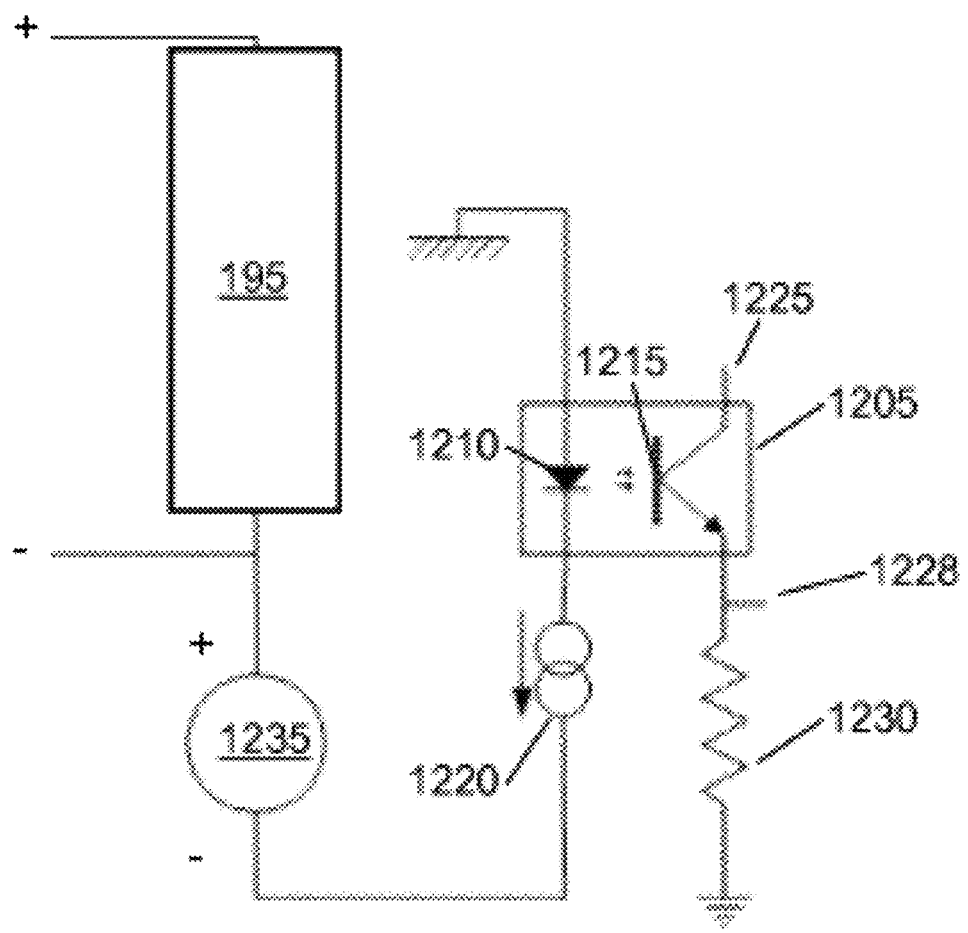
FIG. 12 is a block diagram depicting an exemplary embodiment of the connection fault detection system of the computing device.

FIG. 12 is a circuit diagram depicting an exemplary embodiment of the connection fault detection system of the computing device. The connection fault detection system includes an optocoupler 1205 with a light emitting diode 1210 and a transistor 1215, such as a phototransistor. One terminal of the light emitting diode 1210 connects to ground (also referred to herein as "a node at a ground zero reference level"), such as a chassis of an electric vehicle. The other terminal of the light emitting diode 1210 connects to a current sink 1220. One terminal of the transistor 1215 connects to a voltage source 1225. The other terminal connects to a node corresponding to the output 1228 of the optocoupler 1205 (also referred to herein as the "output node"). This node connects to a resistor 1230 that also connects to a ground zero reference level, which can be electrically isolated from the battery pack 190. The current sink 1220 connects to the negative terminal of a voltage source 1235. The positive terminal of the voltage source 1235 connects to the negative terminal of at least one battery unit 195 of the battery pack 190.

In operation, when none of the terminals of the battery units 195 connect to ground, current does not flow through the light emitting diode 1210 of the optocoupler 1205. The light emitting diode 1210 does not activate the transistor 1215, and the transistor 1215 does not conduct. Because the node 1228 corresponding to the optocoupler's 1205 output is disconnected from the voltage source 1225, any charge at the node drains through the resistor 1230 to ground. In this manner, the optocoupler 1205 outputs a logic low signal, such as 0V, indicating that a connection fault has not been detected.

When a positive terminal of a battery unit 195 does connect to a zero-voltage reference level, current flows through the light emitting diode 1210 to the current sink 1220. The current activates the transistor 1215 so the transistor 1215 conducts. Current flows from the voltage source 1225, building charge at the output node 1228. Thus, the optocoupler 1205 outputs a logic high signal indicating that a connection fault has been detected. The logic high signal can be applied to CPU 905, which can output a message to the display device warning an operator of the battery unit management system of a potentially hazardous connection fault.

The voltage sources 1225, 1235 can have any voltage. For example, voltage source 1225 can provide 3.3V. Voltage source 1235 can provide 5.0V. The current sink 1220 can limit the current flowing through itself and the light emitting diode 1210 to any current, such as a minimum safe level of current. For example, the current sink 1220 can limit the current to 2 mA. The current sink 1220 can operate over a range of voltages of the battery pack 190, such as the voltages between the battery pack's 190 positive and negative terminals. In some embodiments, this range can be from about 5V to about 500V. In some embodiments, the current sink 1220 can operate at voltages that exceed the voltage at the positive terminal of the battery pack 190.

Figure 13:
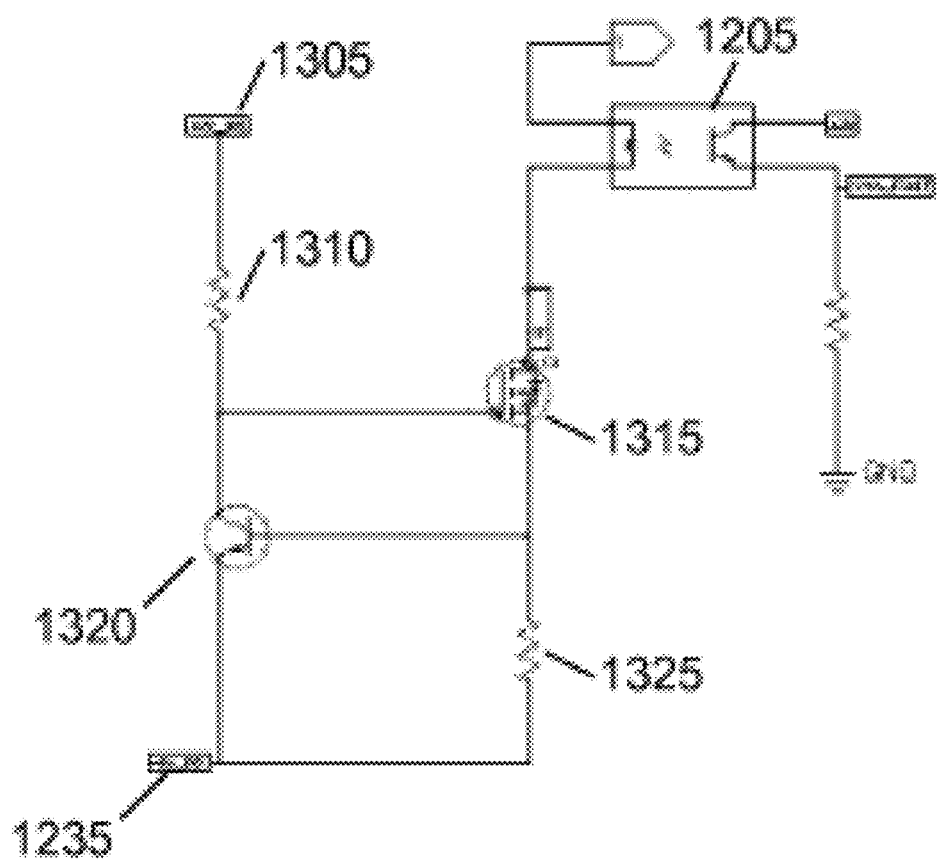
FIG. 13 is a circuit diagram depicting an exemplary embodiment of the connection fault detection system of the computing device.

FIG. 13 is another circuit diagram depicting an exemplary embodiment of the connection fault detection system of the computing device. This embodiment includes all the components described in reference to FIG. 12. In addition, in this embodiment, the current sink 1220 includes a voltage source 1305, a first resistor 1310, a first transistor 1315, a second transistor 1320, and a second resistor 1325. The voltage source 1305 connects to one terminal of the first resistor 1310. The other terminal of the first resistor 1310 connects to the gate of the first transistor 1315 and the emitter of the second transistor 1320. The source of the first transistor 1315 connects to the optocoupler 1205. The drain of the first transistor 1315 connects to the base of the second transistor 1320 and one terminal of the second resistor 1325. The other terminal of the second resistor 1325 connects to the collector of the second transistor 1315 and the negative terminal of the voltage source 1235.

In operation, current flows from the voltage source 1305 through the first resistor 1310 to activate the first transistor 1315 such that the first transistor 1315 conducts. When a terminal of a battery unit 195 connects to ground, current flows through the optocoupler 1205, the first transistor 1315, and the second resistor 1325. The voltage that develops across the second resistor 1325 activates the second transistor 1320. As the second transistor conducts 1320, current is diverted from the gate of the first transistor 1315. The transistors 1315, 1320 and resistors 1310, 1325 reach equilibrium such that a constant current flows through the first transistor 1315.

The transistors 1315 can be any type of transistor, such as a metal-oxide-semiconductor field-effect transistor (MOSFET), an insulated gate bipolar transistor (IGBT), or a NPN transistor. In some embodiments, a 2N3904-type transistor is used for the second transistor 1320.

Figure 14:
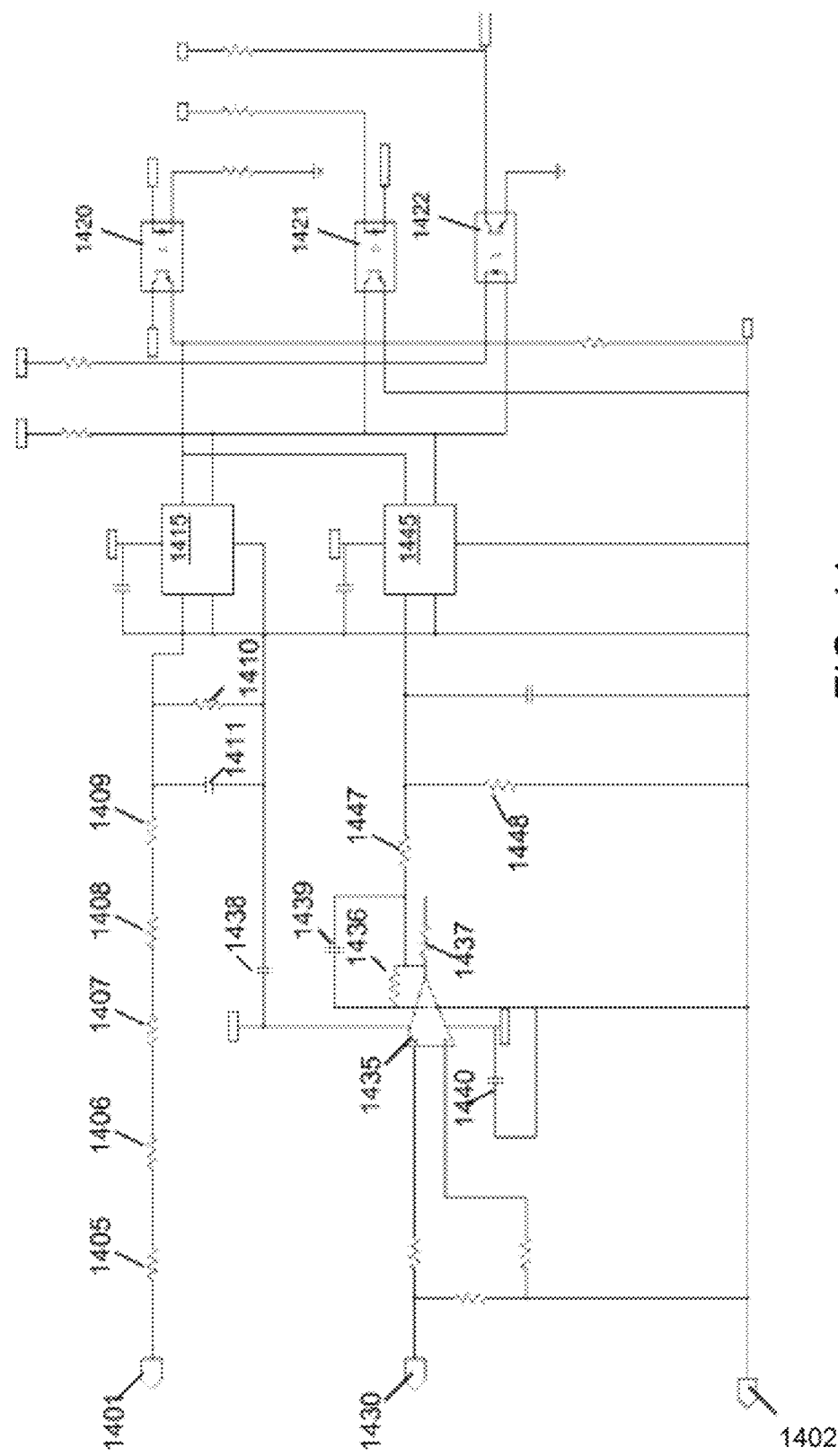
FIG. 14 is a circuit diagram depicting an exemplary embodiment of the pack voltage and pack current input systems of the computing device.

FIG. 14 is a circuit diagram depicting an exemplary embodiment of the pack voltage and pack current input systems of the computing device. The battery pack 190 can connect to the systems at terminals 1401, 1402. Resistors 1405, 1406, 1407, 1408, 1409, 1410 can divide the battery pack 190 voltage from 500V to 2V, by way of example. A capacitor 1411 can filter the divided voltage, and an A/D converter 1415 can sample the voltage. The A/D converter 1415 can transmit the voltage to a processor of the computing device 110, such as CPU 905. Optocouplers 1420, 1421, 1422 can create an isolated communication interface between the A/D converter 1415 and the processor.

The voltage drop across a shunt can be input at terminal 1430. The operational amplifier 1435, resistors 1436, 1437, and capacitors 1438, 1439, 1440 can form an amplifier to amplify the voltage drop. Because the amplifier has a fixed gain, such as 80, the amplified voltage may exceed the capacity of the A/D converter 1445 that samples the voltage. Thus, resistors 1447, 1448 can form a voltage divider that divides the amplified voltage to a level the A/D converter 1445 can process. The A/D converter 1445 can sample the voltage and transmit the voltage to the processor, which can calculate the battery pack 190 current based on the value of the shunt. The A/D converter 1445 can use the same communication interface as the A/D converter 1415 to transmit its sampled voltage.

Figure 15:
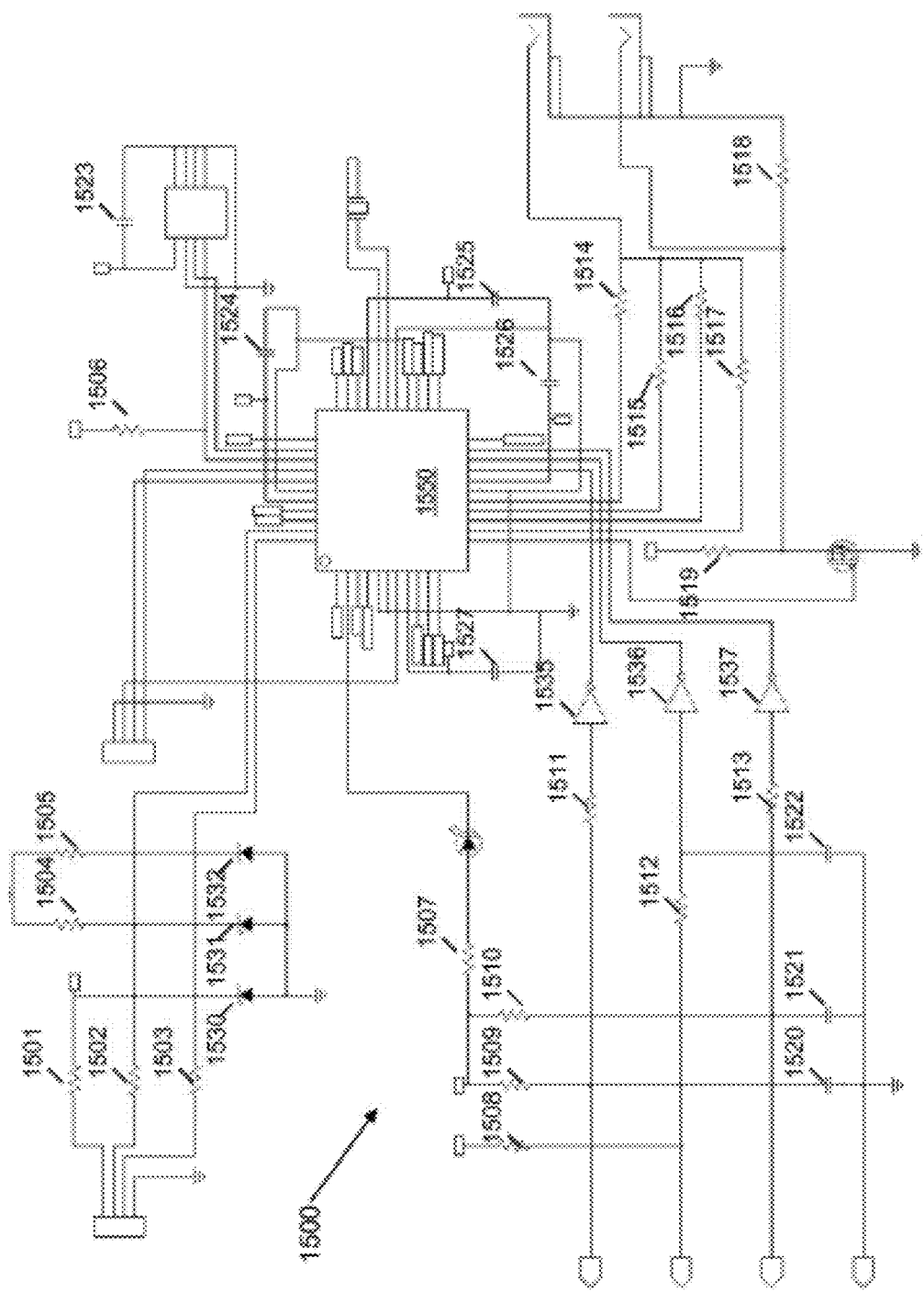
FIG. 15 is a circuit diagram depicting an exemplary embodiment of the processor of the computing device.

FIG. 15 is a circuit diagram depicting an exemplary embodiment 1500 of the central processing unit 905 of the computing device 110. Resistors 1501-1519, capacitors 1520-1527, Zener diodes 1530-1532, and inverters 1535-1537 condition the inputs and outputs for the central processing unit 1550.

Figure 16:
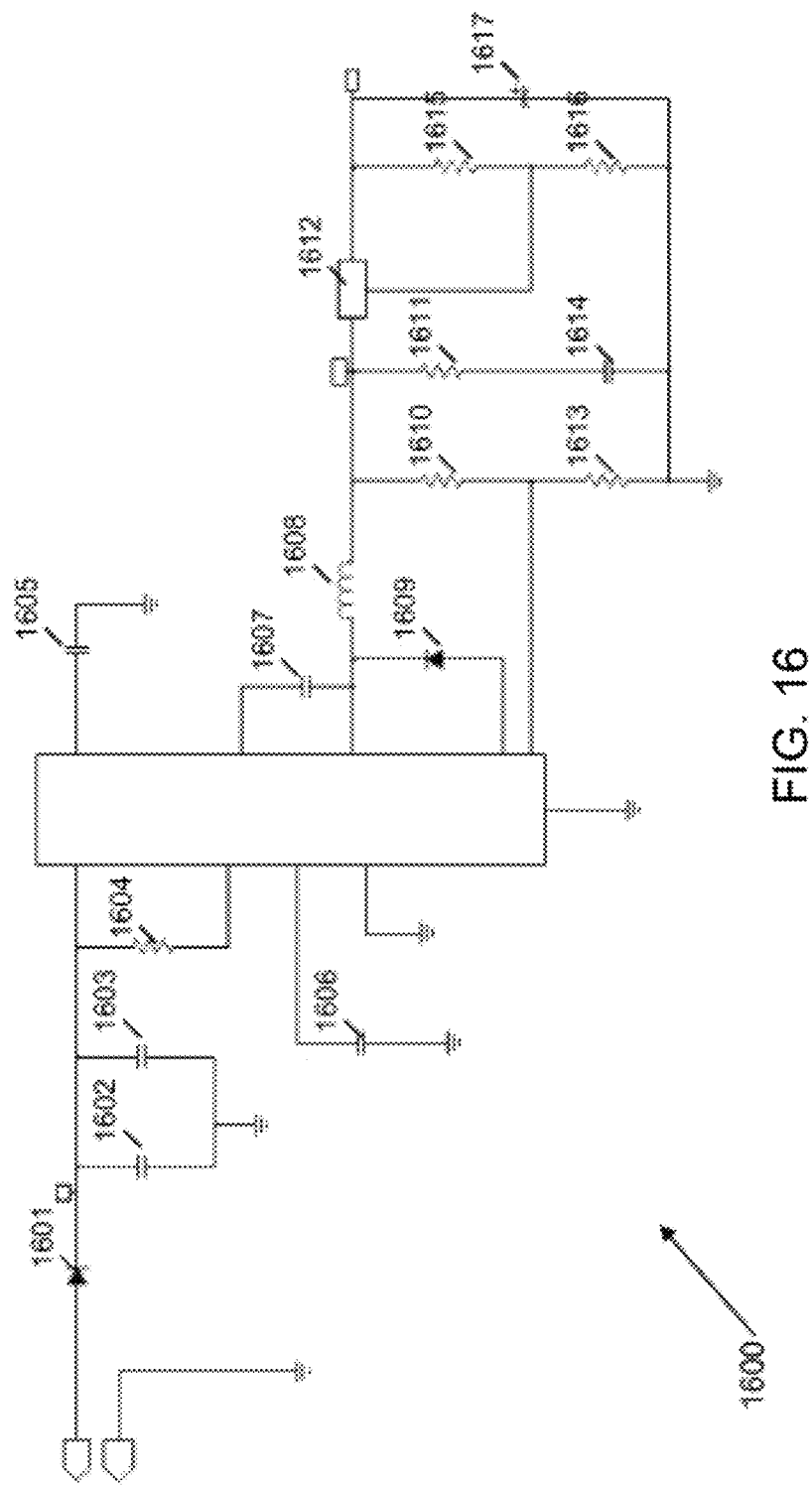
FIG. 16 is a circuit diagram depicting exemplary embodiments of power supplies used with the battery management system.

FIG. 16 is a circuit diagram 1600 depicting an exemplary embodiment of a power supply that can be used with the battery management system 100. The power supply 1600 can be a step down switching voltage regulator. The components 1601-1616 can operate to produce a voltage, such as 5V or 12V. In particular, component 1612 can be a linear voltage regulator that accepts a voltage produced by the other components of the system and outputs a substantially constant 3.3V.

Figure 17:
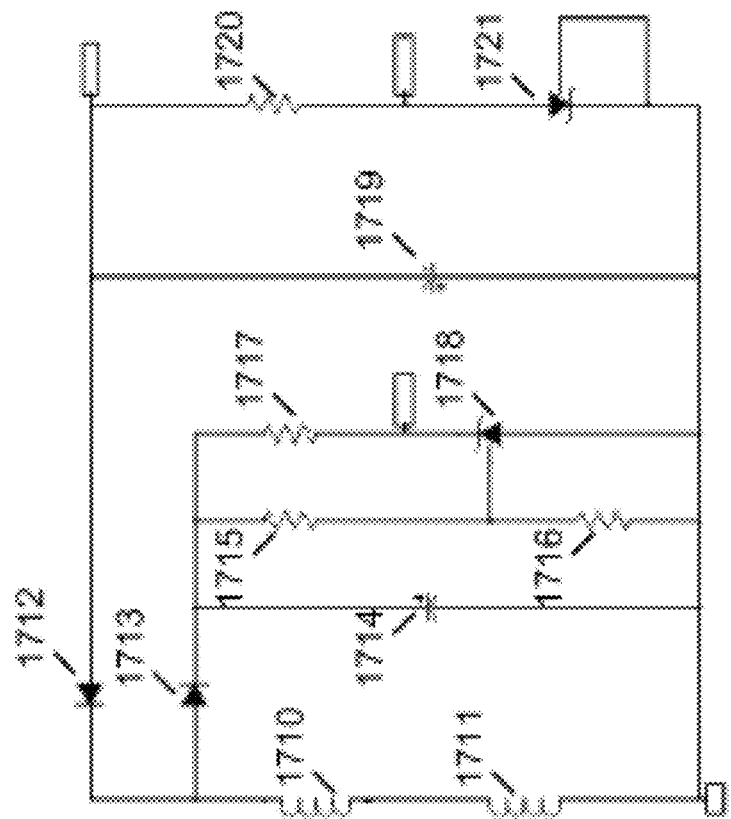
FIG. 17 is a circuit diagram depicting an isolated power supply to power the circuits of FIG. 14.
Figure 17:
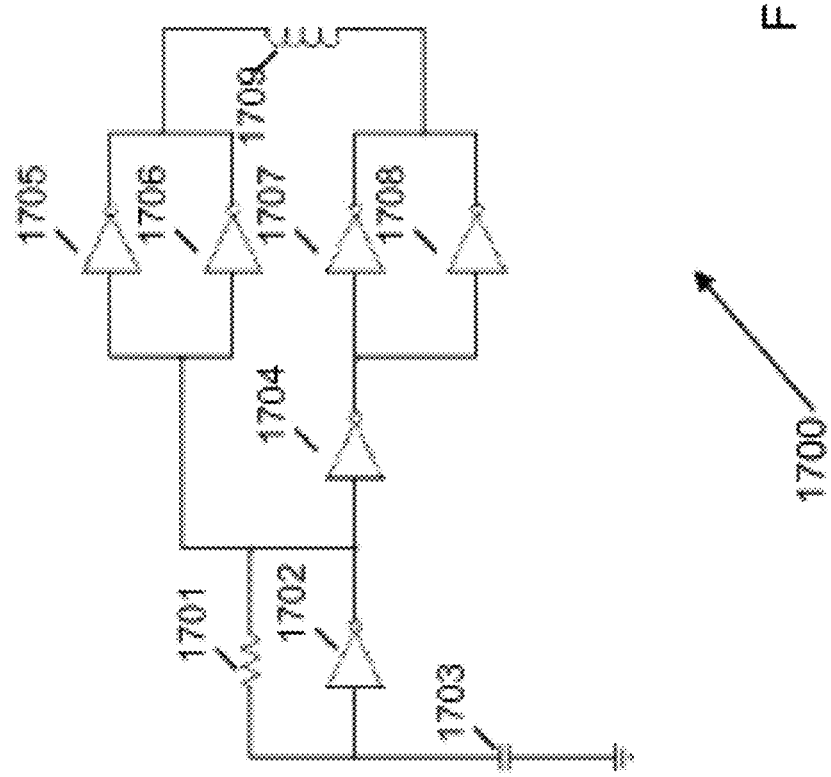

FIG. 17 is a circuit diagram 1700 depicting an exemplary embodiment of another power supply that can be used with the battery management system 100. The power supply 1700 can be an isolated power supply. Components 1701-1708 can operate as an oscillator that produces 40 KHz. The transformer with windings 1709-1711 can transfer energy produced by the oscillator to components 1712-1721, which can operate as positive and negative half-wave rectifiers and a shunt regulator. The rectifiers and shunt regulator can operate to produce a substantially constant output voltage.

Figure 18:
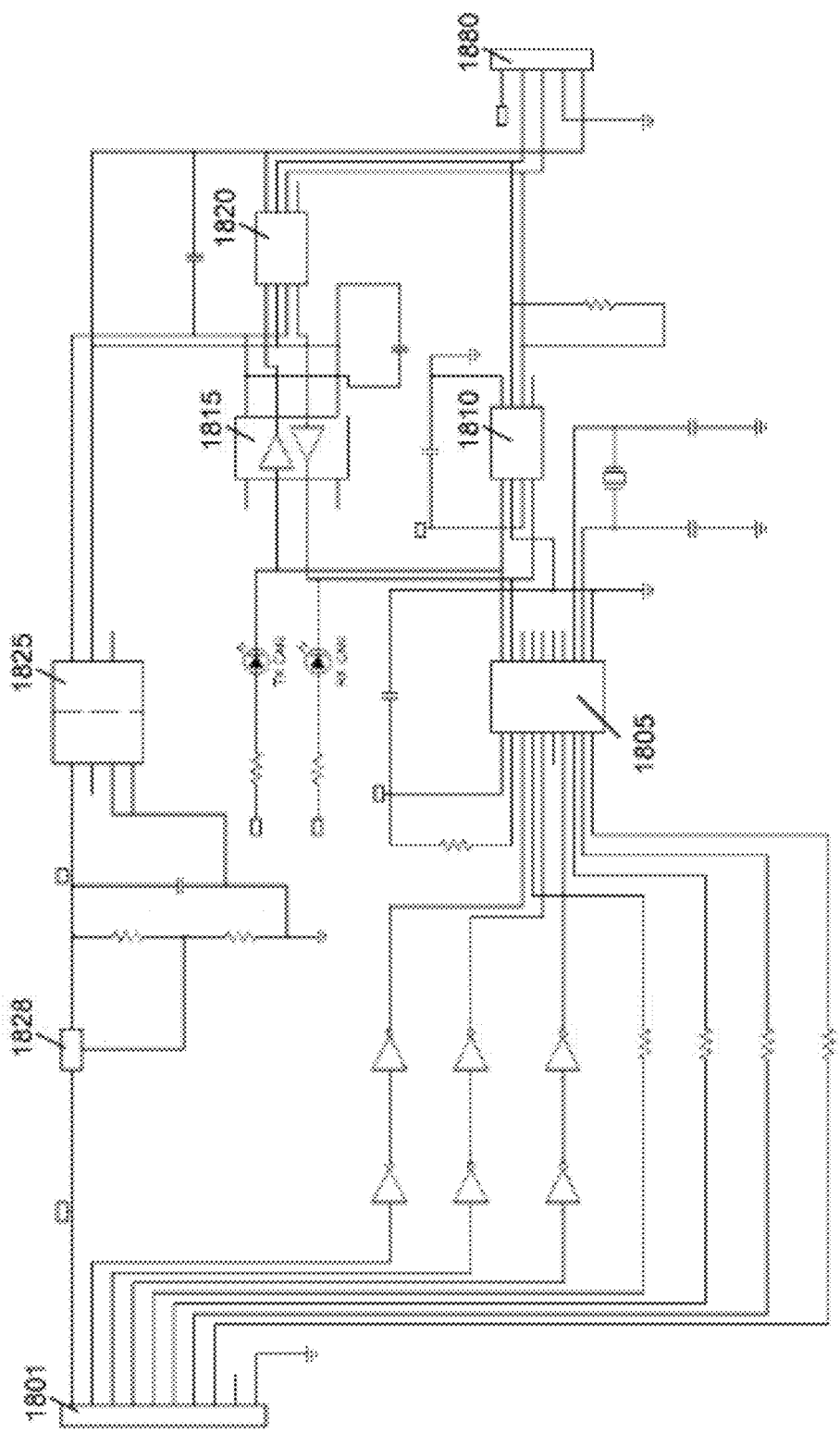
FIG. 18 is a circuit diagram depicting exemplary embodiments of a controller area network (CAN) interface.

FIG. 18 is a circuit diagram depicting an exemplary embodiment of a controller area network (CAN) interface used with the battery management system 100. The interface can be used to connect a CPU 905 of a computing device 110 with an external device via a CAN bus. A connector 1801 can attach to a component of the computing device 110, such as the CPU board. The other connector 1880 can attach to a CAN bus that connects to an external device. The computing device 110 and external device can communicate over the interface using a standard bus protocol such as a serial peripheral interface (SPI) protocol. In some embodiments, the devices can use handshaking signals, such as receiver buffer full and interrupt.

The interface chip 1805 can operate in a non-isolated mode or an isolated mode. In the non-isolated mode, the interface chip 1805 communicates with the bus buffer 1810 with data received, for example, from an external CAN-enabled device. In some embodiments, the bus buffer 1810 can receive data from the bus ports 1880. The interface chip 1805 can send a transmit signal to the buffer 1810 so the buffer 1810 outputs its data to the bus ports 1880. The interface chip 1805 can send a receive signal so the buffer 1810 outputs its data obtained from the bus ports to the interface chip 1805.

In the isolated mode, an isolator 1815 isolates the interface chip's 1805 transmit and receive signals from a buffer 1820. The isolator 1815 can be a magnetic isolator. An isolated power supply 1825 can use a voltage from a voltage regulator 1828 to provide power for the isolator 1815 and buffer 1820. In some embodiments, the voltage regulator 1828 receives a 12V signal and outputs a 5V signal.

In view of the structure, functions and apparatus of the system described herein, the present disclosure provides an efficient and intelligent battery management system. Having described certain embodiments of the battery management system, it will now become apparent to one of skill in the art that other embodiments incorporating the concepts of the disclosure may be used. Therefore, the invention should not be limited to certain embodiments, but should encompass the spirit and scope of the claims.

Figure 19:
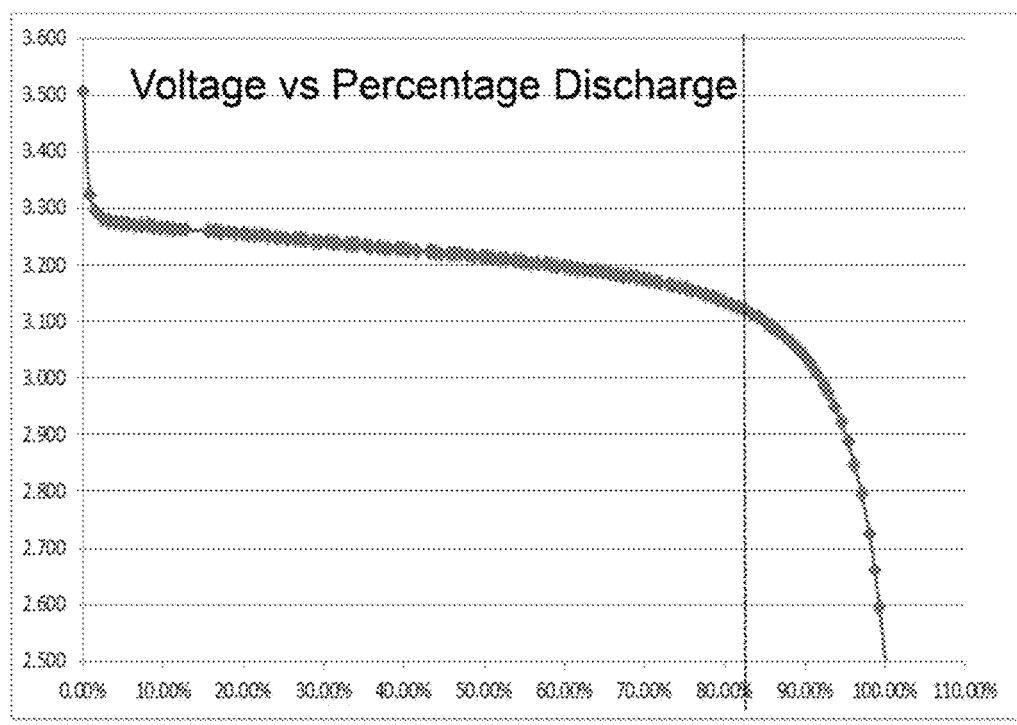
FIG. 19 shows an exemplary discharge profile for a lithium battery.

As shown in FIG. 19, a lithium battery has a non-linear discharge profile. The discharge rate from approximately 5% to 80% of full charge is substantially linear but has a very small slope. Therefore, it is difficult to estimate the state of charge of a battery, or battery unit by measuring the voltage. Small variations in voltage may result in erroneous estimates of the state of charge. As described herein, a power control system may calculate the time remaining before a battery pack should be shut down when being used as the output power supply. The power control system and specifically the computing device may initiate battery shut down if a calculated value of 80% discharged or more is reached.

Figure 20:
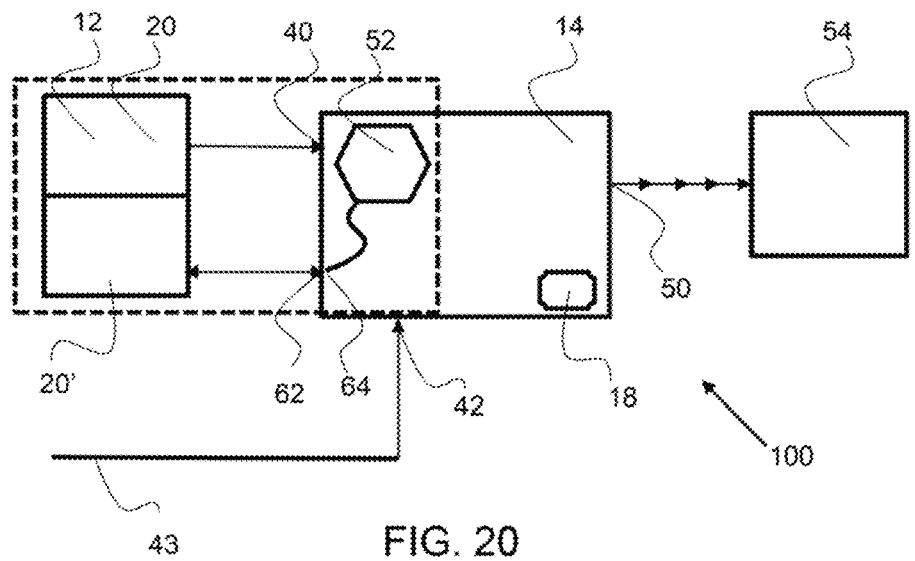
FIG. 20 shows a diagram of an exemplary lithium battery power supply system.

As shown in FIG. 20, an exemplary lithium battery power supply system 10 comprises a battery pack 12, and a power control system 14. The battery pack 12 has a first battery unit 20 and a second battery unit 20'. A battery data input provides data about the status of the battery unit and batteries configured therein to the computing device 52 through the battery data input 62. A computing device may request data from battery monitoring modules (not shown), through the data request output 64. The battery pack is coupled to the power control system 14 by a battery power input 40. An AC power input 42 is connected to an AC power line or cable. In an exemplary embodiment, the power control system utilizes the AC power for output power unless there is an interruption or disturbance in the incoming AC power. A data transmission system 18 is configured to send pertinent data related to the battery management system to an external location, such as a monitoring station. A powered device 54 is connected to the power control system at the power output connector 50. The battery management system 100 controls the charging and discharging of batteries and balances the battery system to prevent large variations between individual battery voltages within a battery pack. A discharge circuit may be used to reduce the voltage of a battery when has a voltage higher than the other batteries in the battery pack. This discharge circuit may be used as a battery heating circuit, wherein a resistor or transistor that heats with current flow acts as the heater for the battery.

Figure 21:
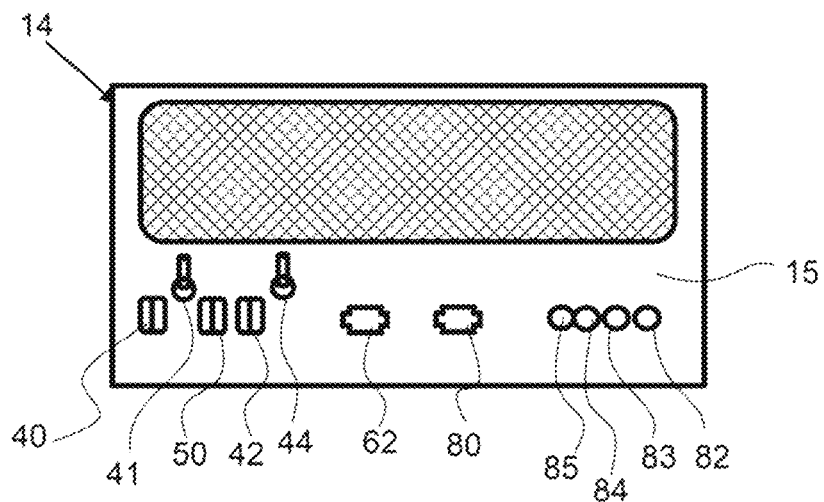
FIG. 21 shows an exemplary power control system and a plurality of input, outputs and indicators.

As shown in FIG. 21, an exemplary power control system 14 comprises a plurality of inputs, outputs and indicators. In an exemplary embodiment, a power control system is configured in a single enclosure 15, thereby making installation of the battery management system quick and easy. A battery power input 40 is configured to connect to a battery pack to receive power from said battery pack. A battery on/off switch 41 may be used to temporarily disable battery power in the event that the system requires maintenance or repair. An AC power switch 44 is also shown. A power output connector 50 is configured for providing power to an electronic device and may be any suitable type of plug. An AC power input 42 is configured to couple to an AC power line or cable and may also comprise any suitable type of plug. An AC power switch is configured to enable or disable AC power input. A battery data input 62 is configured to couple to a battery monitoring module to receive data input regarding the battery pack, unit or individual batteries. As described herein a battery data input may be configured to receive a data transmission cable and in some embodiments, comprises a wireless signal receiver. A remote data output connector 80 is configured to couple with a cable or line, such as a phone-line, DSL line, fiber optic line and the like. Again, a remote data output connector may be a wireless signal transmitter that is configured to send data output wirelessly. A number of indicators, such as lights, are also shown, a computing device indicator 85, a data reception indicator 84, a data transmit indicator 83 and an AC input indicator 82. These indicators may indicate that a particular function is current active.

Figure 22:
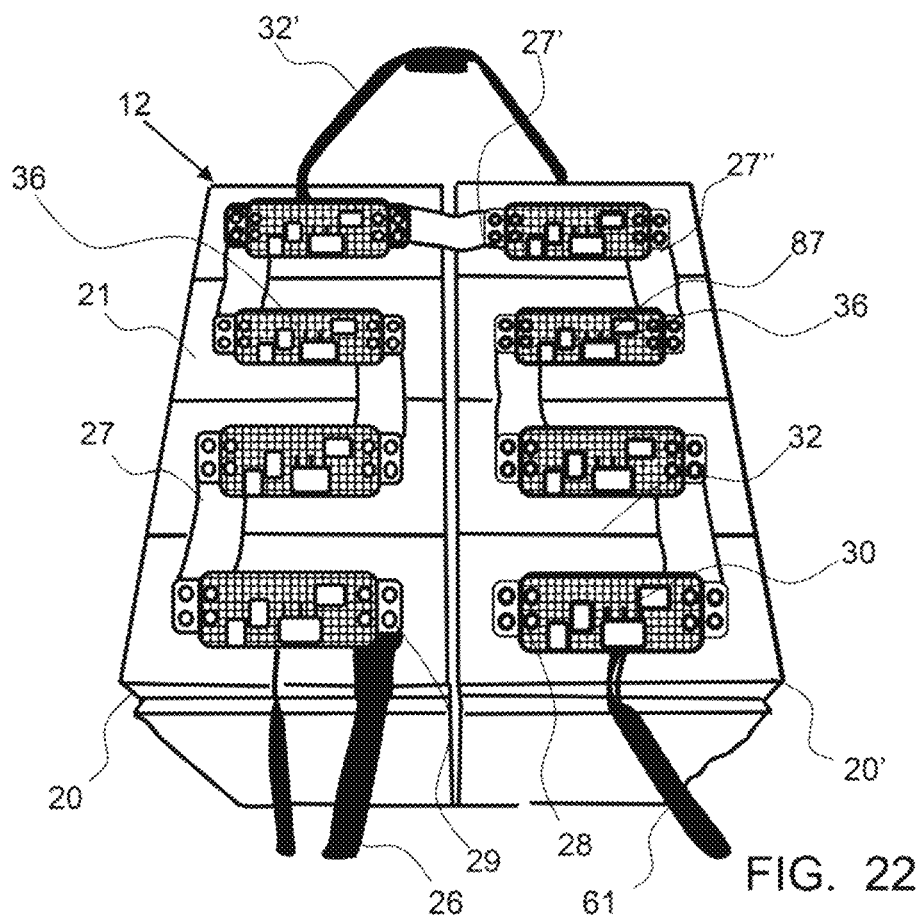
FIG. 22 shows a top perspective view of an exemplary battery pack with battery monitoring modules configured thereon.

As shown in FIG. 22, an exemplary battery pack 12 comprises two battery units 20 and 20', each having four individual lithium batteries 21. The batteries are all connected in series by jumpers 27. A jumper 27' connects the first battery unit 20 with the second battery unit 20'. Battery monitoring modules 30 are configured between the positive 28 and negative 29 terminals of the batteries. A battery monitoring module may comprise a voltage sensor 34 and/or a temperature sensor 36. A circuit 87 on a module 30 may be configured to determine the voltage state of a battery. Module connectors 32 connect battery monitoring modules in a daisy-chain configuration. Module connector 32' couples a battery monitoring module from the first battery unit to a battery monitoring module on the second battery unit. A battery power cable 26 is configured to provide power to the power control system. A battery module cable 61 is configured to couple with a battery data input, as shown in FIG. 22.

Figure 23:
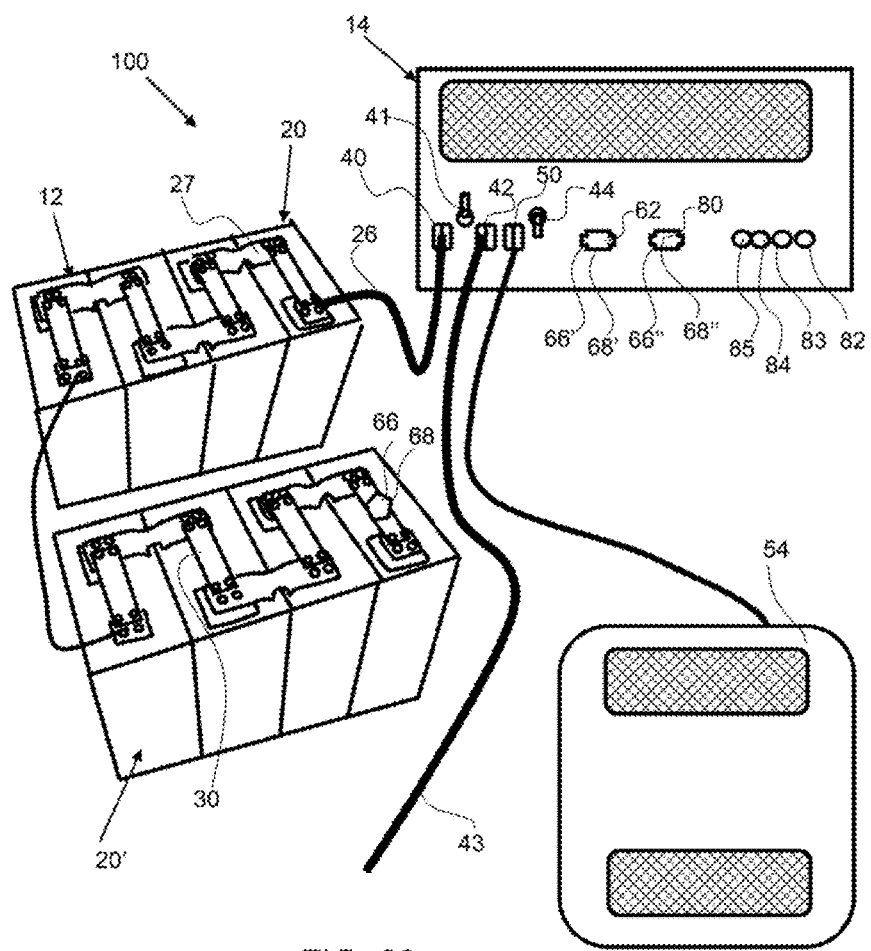
FIG. 23 shows diagram of an exemplary lithium battery power supply system.

As shown in FIG. 23, an exemplary battery management system 100 comprises a battery pack 12 and a power control system 14. In this exemplary embodiment, only a battery power cable physically couples the battery pack to the power control system. Data from the battery monitoring modules 30 is wirelessly transmitted to the power control system. A wireless transmitter 66 and wireless receiver 68 are coupled on the battery pack 10 and transmit battery status information to the control system. Likewise, the control system comprises a wireless transmitter 66' and wireless receiver 68' for requesting battery status information and receiving battery status information respectively. A powered device 54 is plugged into the power output connector 50. An AC power line 43 is coupled with the power control system.

Figure 24:
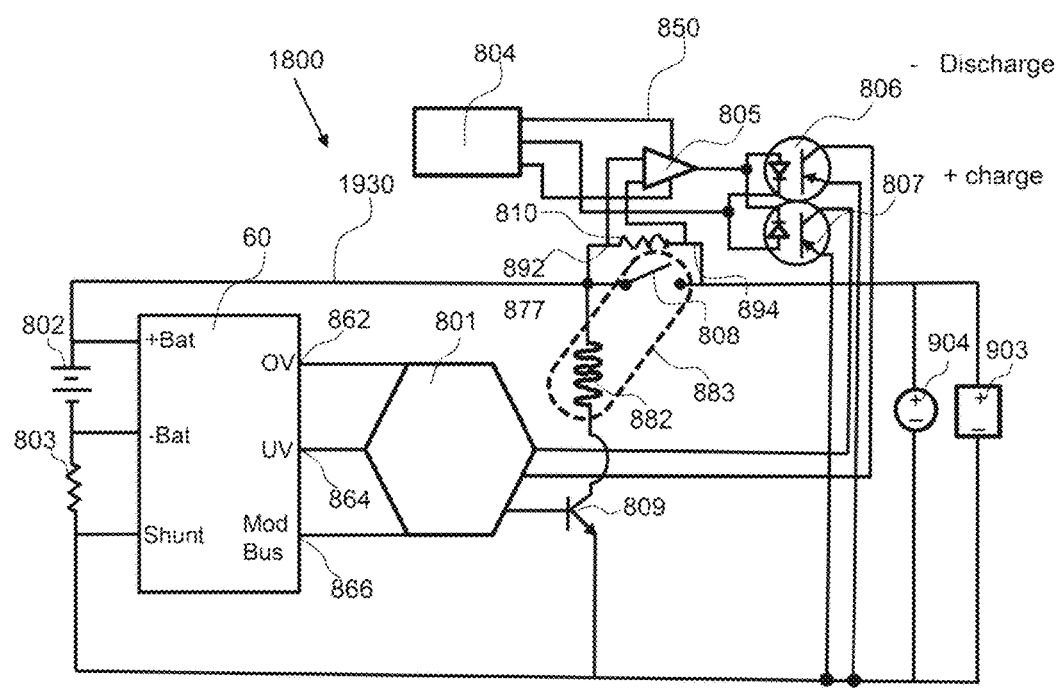
FIG. 24 shows an exemplary automatic battery control system diagram comprising an automatic battery control circuit coupled with a battery management system, a microprocessor, a battery unit and load.

As shown in FIG. 24, an exemplary automatic control system 1800 comprises an automatic control circuit 850 circuit that enables automatic control of the charging and discharging of a battery without interruption of disconnects or shut-downs due to irrelevant alarms. The automatic control system is used in conjunction with a battery management system 60, as described in any of the embodiments herein. The battery management system provides the automatic control system with an under-voltage output 864 signal when the battery is below a lower charge threshold value and is ready for charging, an over-voltage output 862 signal when the battery is above an upper charge threshold and is ready for discharging. A current flow output, 866 such as a MODBUS, or equivalent, provides a measure of the current to a load 904 or from a power source 903 for charging, or charging power source. A microprocessor 801 receives these inputs and opens or closes the relay contactor based on these outputs from the battery management system 60, and one of two optocouplers, a discharge optocoupler 806 and charge optocoupler 807. The optocouplers are arranged in anti-parallel, so that a sufficient voltage, either positive or negative polarity, from the difference amplifier, will turn on one of the two optocouplers. A sufficient absolute value of voltage to turn on an optocoupler may be 1.0V or more, 1.5V or more, 1.75V of more, 2.0V or more and any range between and including the values provided. The voltage value produce by the difference amplifier is dependent on the resistance value of the parallel resistor and the difference in potential between the state of charge of the battery and the load or charging power source.

Isolating the battery 802 from the load 904 or charging power source 903 for charging is done by a relay 883 having a single relay contactor 808 under control of the microprocessor 801. The relay comprises the single relay contactor 808 and a transistor 882. A parallel resistor 810 is configured in parallel with the relay contactor from an input side 892 to an output side 894. The parallel resistor provides a voltage potential value to the difference amplifier. The relay 883 has a transistor 882 whose operating voltage is that of the battery. The relay contactor is sized to meet the requirements of the load and the charger. Assuming the system is at rest, the relay contactor 808 of the relay is open. The parallel resistor 810 is configured across the relay contactor and provides a voltage to the load 904 or charging power source 903 such as a charger. If these are inactive, the voltage on the output side 894 of the relay contactor 808 and the parallel resistor 810 will be the same as the input, the battery voltage. If a load 904 is connected, the voltage on the output side 894 of the relay contactor will go down. This difference of the relay contactor 808 or parallel resistor from the input side 892 to the output side 894 or input and out voltages will be sensed by difference amplifier 805 and indicated by discharge optocoupler 806 to microprocessor 801. As long as the battery is not discharged as indicated by the under-voltage output 864 on the battery management system 60, the microprocessor will activate the relay contactor via transistor 809. As soon as the relay contactor 808 is closed, the voltage differential between the output side and input side will become zero, and the output of the discharge optocoupler 806 will turn off. In order for the microprocessor to make the decision to keep the relay contactor closed, it must read a current flowing in the shunt 803 via the current flow output (MODBUS) 866, or other similar communications means, from the battery management system 60. Should the current stop flowing through the shunt 803, the microprocessor will read this from the port on battery management system 60 and open the relay contactor 808 thereby isolating the battery 802 once more.

Battery charging is done in a similar fashion as discharging as outlined above. Assuming the system is at rest, the relay contactor 808 is open. Parallel resistor 810, which is configured in parallel with the relay contactor, provides a voltage to the difference amplifier 805 so that the charging power source 903 will start its' charging cycle. If the charging power source 903 begins charging, the output side 894 voltage will rise above the battery 802 voltage. This difference of the relay contactor 808 input voltage and output voltage, or voltage drop across the relay contactor from the output side 894 to the input side 892, will be sensed by difference amplifier 805 and indicated by charge optocoupler 807 to microprocessor 801. As long as the battery is not charged as indicated by the over voltage output on the battery management system 60, the microprocessor 801 will activate the relay contactor 808 to close via transistor 809. As soon as the relay contactor 808 is closed, the voltage differential between the output and input will become zero, and the output of charge optocoupler 807 will turn off. In order for the microprocessor 801 to make the decision to keep the relay contactors closed, it must read a current flowing in the shunt via the MODBUS, or other similar communications means, from the battery management system 60. Should the current stop flowing through the shunt 803, the microprocessor will read this from the port on battery management system 60 and deactivate open the relay contactor 808 thereby isolating the battery 802 once more.

The battery management system 60 has two state of charge status outputs. The over voltage output 862 indicates that the battery is not charged when high, and when low the microprocessor 801 will not allow the charging power source 903 to be connected to the battery 802. The under-voltage output 864 indicates that the battery is not discharged when high, and when low the microprocessor will not allow the load 904 to be connected to the battery. In this way, when the battery has a state of charge below a lower threshold value, the battery can be charged and any under-voltage signals from the battery management system are ignored and when the battery has a state of charge above an upper threshold value, any overvoltage outputs signals from the battery management system are ignored and the battery can be discharged. An error, such as a failure of the battery management system's ability to read individual cell voltages, will cause both outputs of the battery management system 60 to go low thereby signaling the microprocessor 801 to not allow any charging or discharging the battery 802 by opening relay contactor 808. The automatic battery control system and particularly the battery management system may be powered by an isolated power supply 804 that is fed by a 5V power supply that runs the system.

Figure 25:
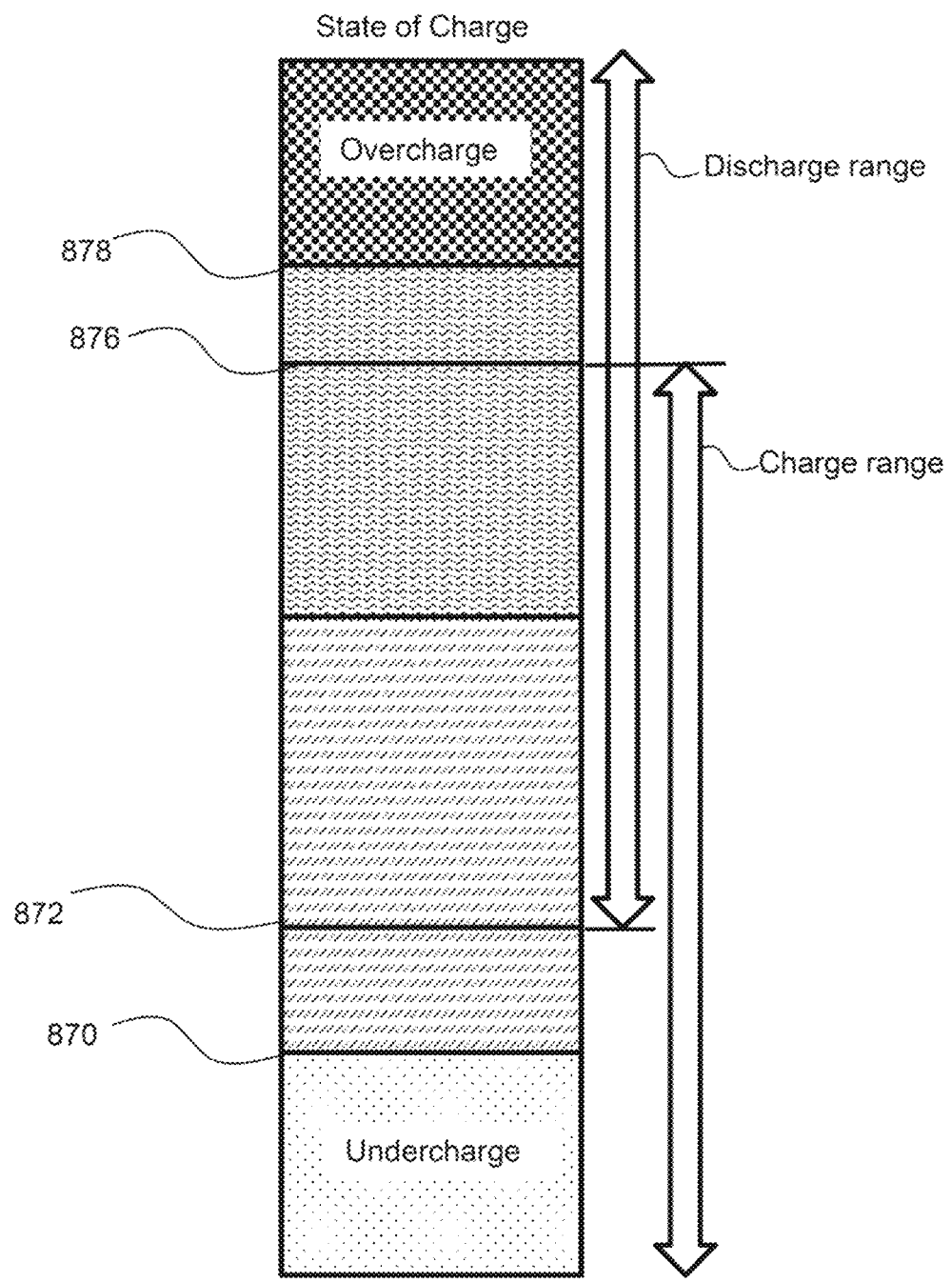
FIG. 25 shows a diagram of a battery state of charge and the limits for charging and discharging.

Referring now to FIG. 25, in an exemplary embodiment, a battery unit will be discharged as long as it is above a threshold discharge value 872, which is offset above the lower threshold limit 870. The threshold discharge value may be set some offset voltage above the lower threshold limit to prevent cycling the battery between charge and discharge modes too frequently. In an exemplary embodiment, a battery unit will be charged as long it is below a charge threshold limit 876, which is offset below the upper threshold limit 878. It is to be understood however that the threshold discharge value and the lower threshold limit may be substantially the same value or the same value, and the threshold charge limit and upper threshold limit may be substantially the same value or the same value. As shown, the system is designed to prevent the battery state of charge from entering into an overcharge state of charge or undercharge state of charge, which may damage the battery unit.

Figure 26:
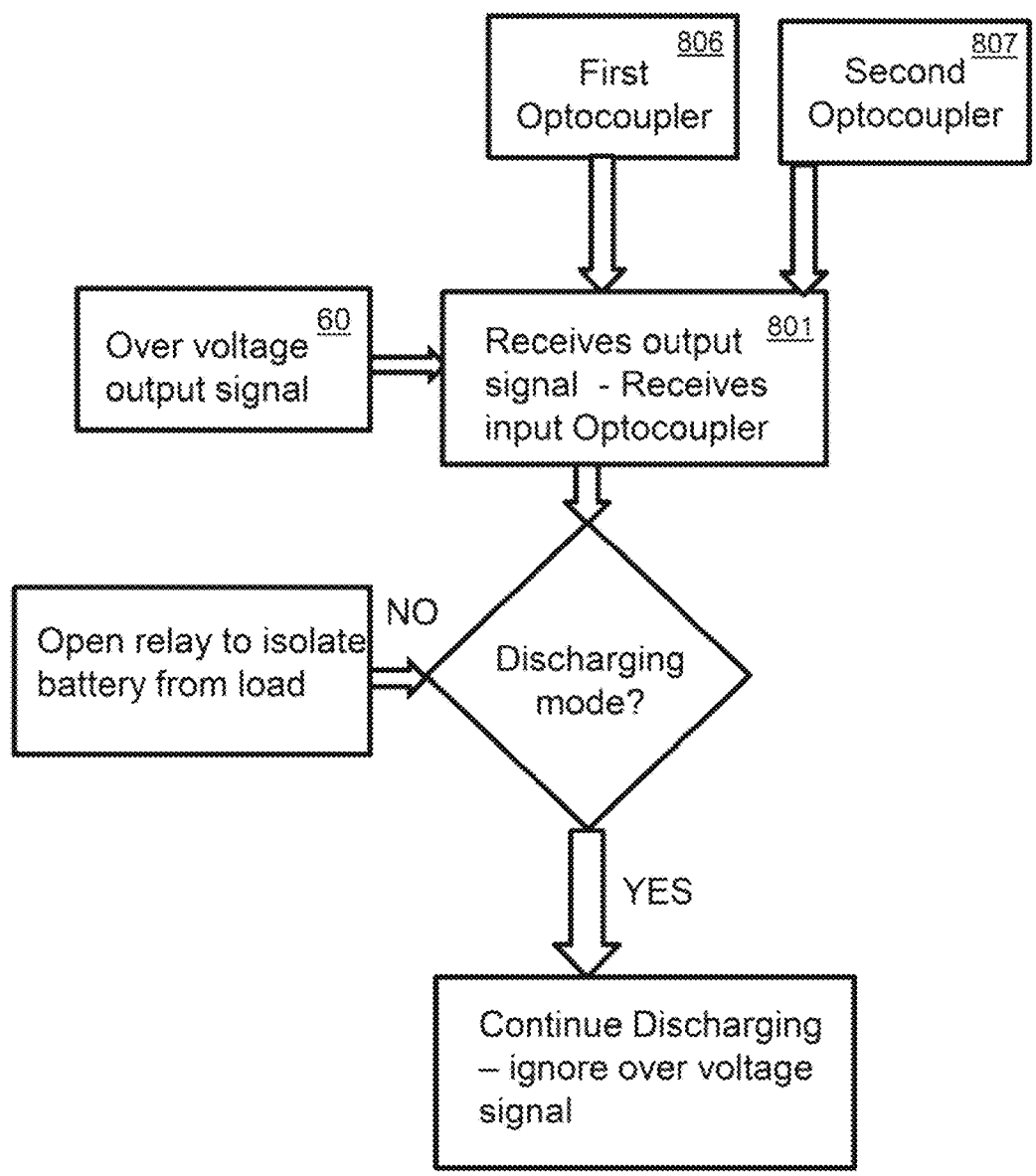
FIG. 26 shows a flow diagram of an automatic battery control system in a discharging mode.

As shown in FIG. 26, a battery management system 60 provides an over voltage output signal to a microprocessor 801 and when discharge optocoupler 806 is providing a discharge-mode signal to the microprocessor that the system is in a discharge mode, the over voltage output signal is ignored and the battery continues to discharge. However, when the discharge optocoupler is not providing the discharge-mode signal, then the relay is opened to isolate the battery from the load and/or the charger.

Figure 27:
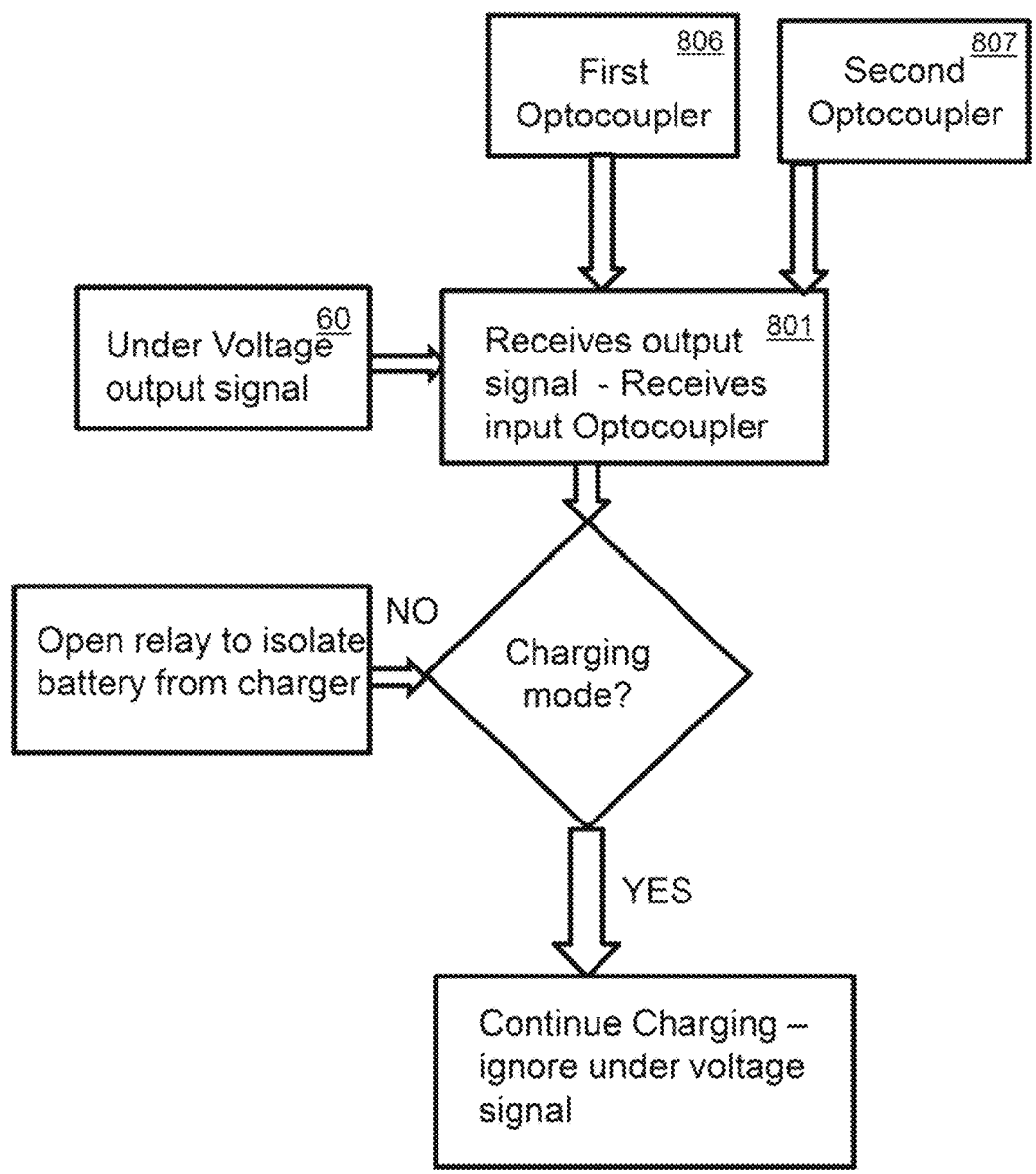
FIG. 27 shows a flow diagram of an automatic battery control system in a charging mode.

As shown in FIG. 27, a battery management system 60 provides an under voltage output signal to a microprocessor 801 and when the charge optocoupler 807 is providing a charge-mode signal to the microprocessor that the system is in a charge mode, the under voltage output signal is ignored and the battery continues to charge. However, when the charge optocoupler is not providing the charge-mode signal, then the relay is opened to isolate the battery from the load and the charger.

Figure 28:
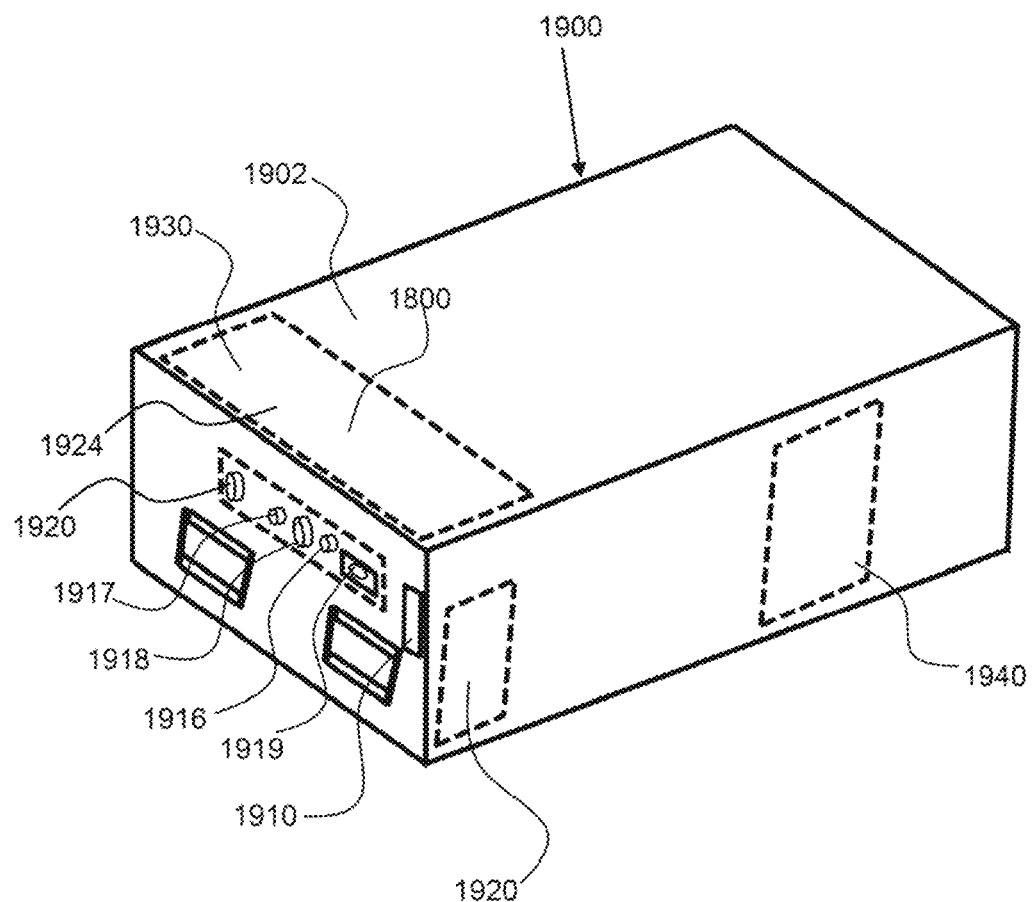
FIG. 28 shows a perspective view of an exemplary automatic rechargeable battery control module.

As shown in FIG. 28, an exemplary automatic rechargeable battery control module 1900 has a power connector 1910. An exemplary automatic control system 1800, comprising an automatic battery control circuit 1930, as described herein, is configured within the housing 1902 along with one or more rechargeable batteries 1940. The exemplary automatic rechargeable battery control module 1900 also has an on/off switch 1920 and a power connector 1910, making installation and operation of the automatic rechargeable battery control module 1900 very easy. The power connector may be coupled with a load, such as to a golf cart to power the drive motors, lights and other electronic devices. The exemplary automatic rechargeable battery control module 1900 also has a charging port 1919, wherein a power source may be coupled, such as by a charger cable that is plugged into an AC outlet. The automatic control system 1800 automatically recognizes when a power source and/or a load is coupled with the module and automatically switches from charging mode to discharge modes as required and depending on the state of charge of the battery or battery pack. The exemplary automatic rechargeable battery control module 1900 also has a state of charge output 1917, that may be connected with a state of charge indicator that inform the driver of the vehicle of a state of charge, for example. The exemplary automatic rechargeable battery control module 1900 has a video port 1916 for connection with an electronic device. A user may view metrics of the battery pack on the electronic device and a mode button 1918 may allow the user to toggle through a menu or from battery to battery within a battery pack to view the metrics of each individual battery.

Figure 29:
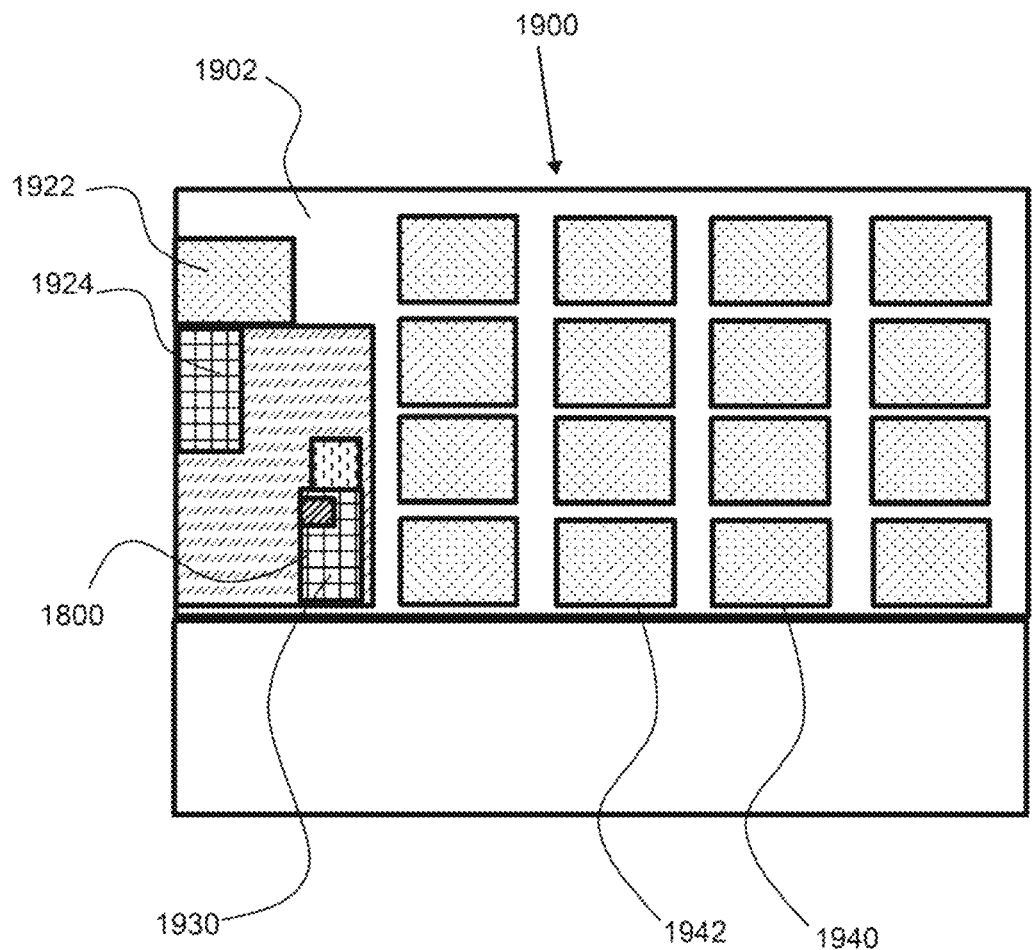
FIG. 29 shows a perspective view the exemplary automatic rechargeable battery control module shown in FIG. 28 with the top removed to show the plurality of rechargeable batteries and the automatic battery control system within the housing of the module.

As shown in FIG. 29, an exemplary automatic rechargeable battery control module 1900 comprises a plurality of individual rechargeable batteries 1940 to produce a battery pack 1942. As shown, sixteen rechargeable batteries are configured to produce a 48-volt output when the rechargeable batteries are lithium ion batteries having a voltage of 3.2V. An exemplary automatic control system 1800, comprising an automatic battery control circuit 1930, as described herein, is configured within the housing 1902 and automatically switches between charging and discharging modes. A battery controller 1924 and battery inverter 1922 may also be configured within the housing 1902 of the module.

Figure 30:
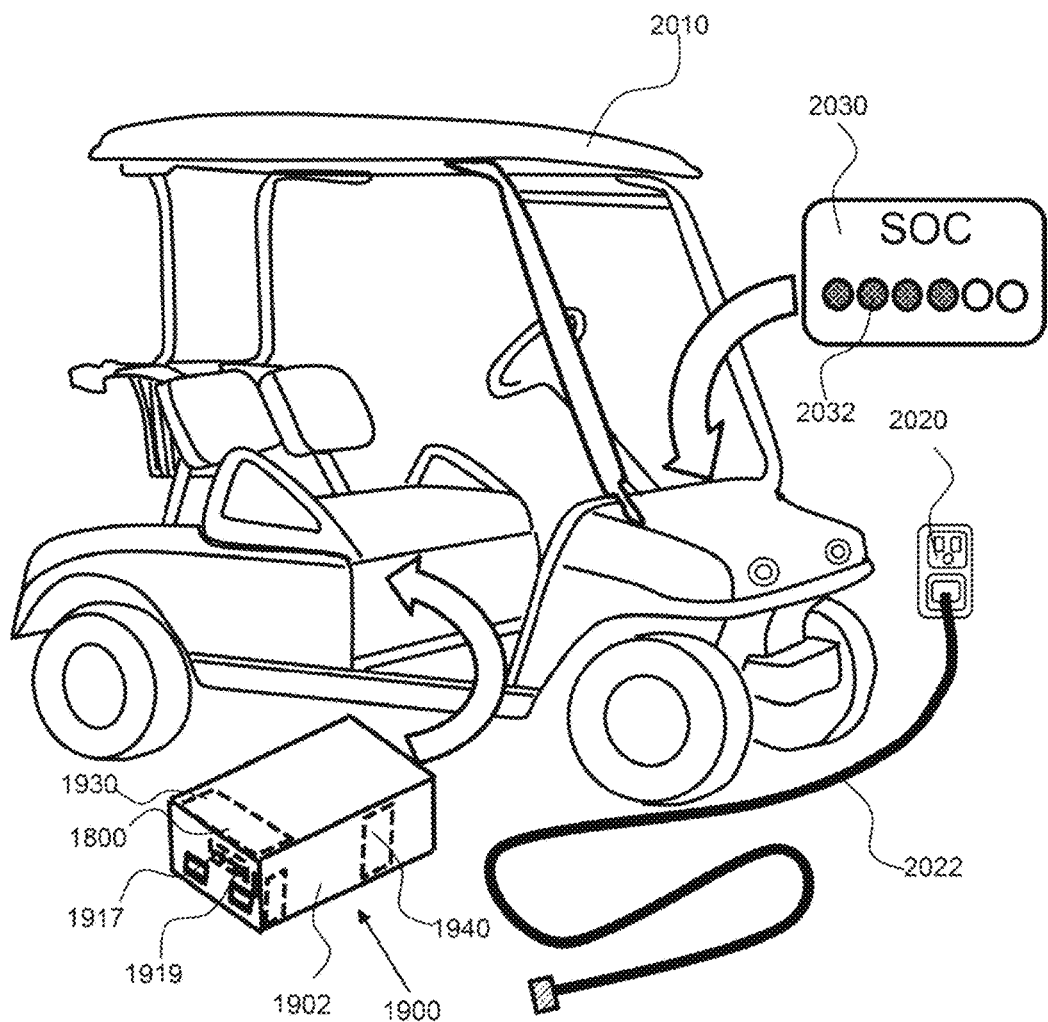
FIG. 30 shows a golf cart and an exemplary automatic rechargeable battery control module for providing power to the golf cart and a state of charge, SOC, indicator.

FIG. 30 shows a golf cart 2010 and an exemplary automatic rechargeable battery control module 1900 for providing power to the golf cart. The exemplary automatic rechargeable battery control module may be configured under the seat of the golf cart, as indicated by the bold curved arrow, and may provide electrical power to the drive motors to propel the golf cart and to lights, and other electronic devices of the golf cart. The exemplary automatic rechargeable battery control module may comprise a state of charge output 1917, that is coupled with a state of charge, SOC, indicator 2030. The state of charge indicator has a plurality of indicator lights 2032 that are illuminated to indicate a state of charge. As shown, only four of the six lights are illuminated to indicate about a 66% state of charge from a full state of charge. The exemplary automatic rechargeable battery control module comprises a charging port 1919 that may be connected to a power source, such as grid power delivered through the AC outlet 2020 and supplied through the charger cable 2022. Again, the exemplary automatic rechargeable battery control module 1900 comprises an automatic control system 1800, comprising an automatic battery control circuit 1930, as described herein, that is configured within the housing 1902 and automatically switches between charging and discharging modes. The exemplary automatic rechargeable battery control module 1900 is very simple to install and operate and does not require any manual switching between charging and discharging modes.

Figure 31:
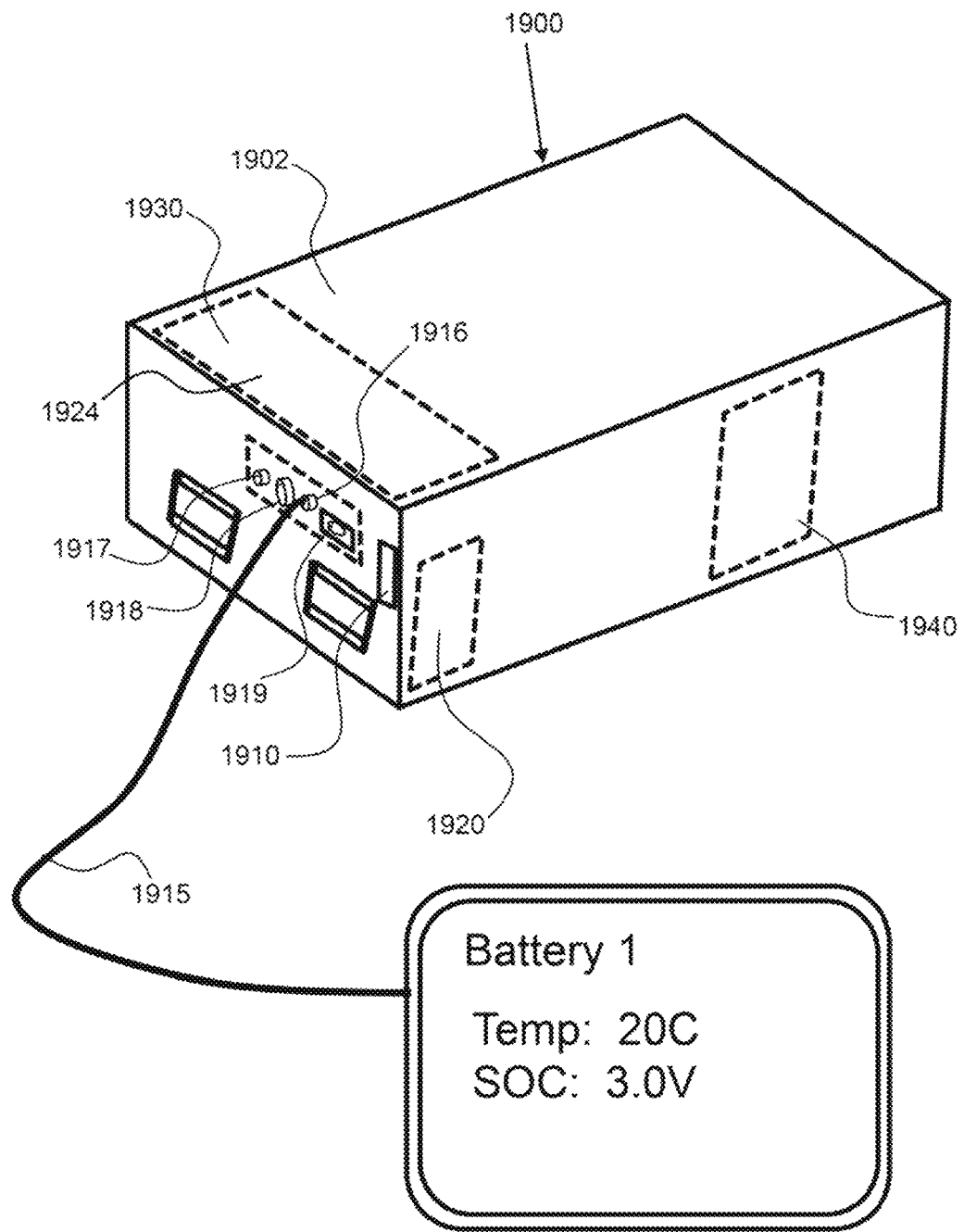
FIG. 31 shows a perspective view of a plurality of exemplary automatic rechargeable battery control module having a video port that is connected with and electronic device by a video cable to display metrics of the battery pack.

As shown in FIG. 31, an exemplary automatic rechargeable battery control module 1900 comprises a video port 1916 and a video cable 1915 connects the exemplary automatic rechargeable battery control module with an electronic device that displays metrics of the battery pack, such as state of charge and/or battery temperature, for example. A mode button 1918 may allow a user to toggle through metrics of each battery within the battery pack and may allow a user to identify a battery that is defective.

Figure 32:
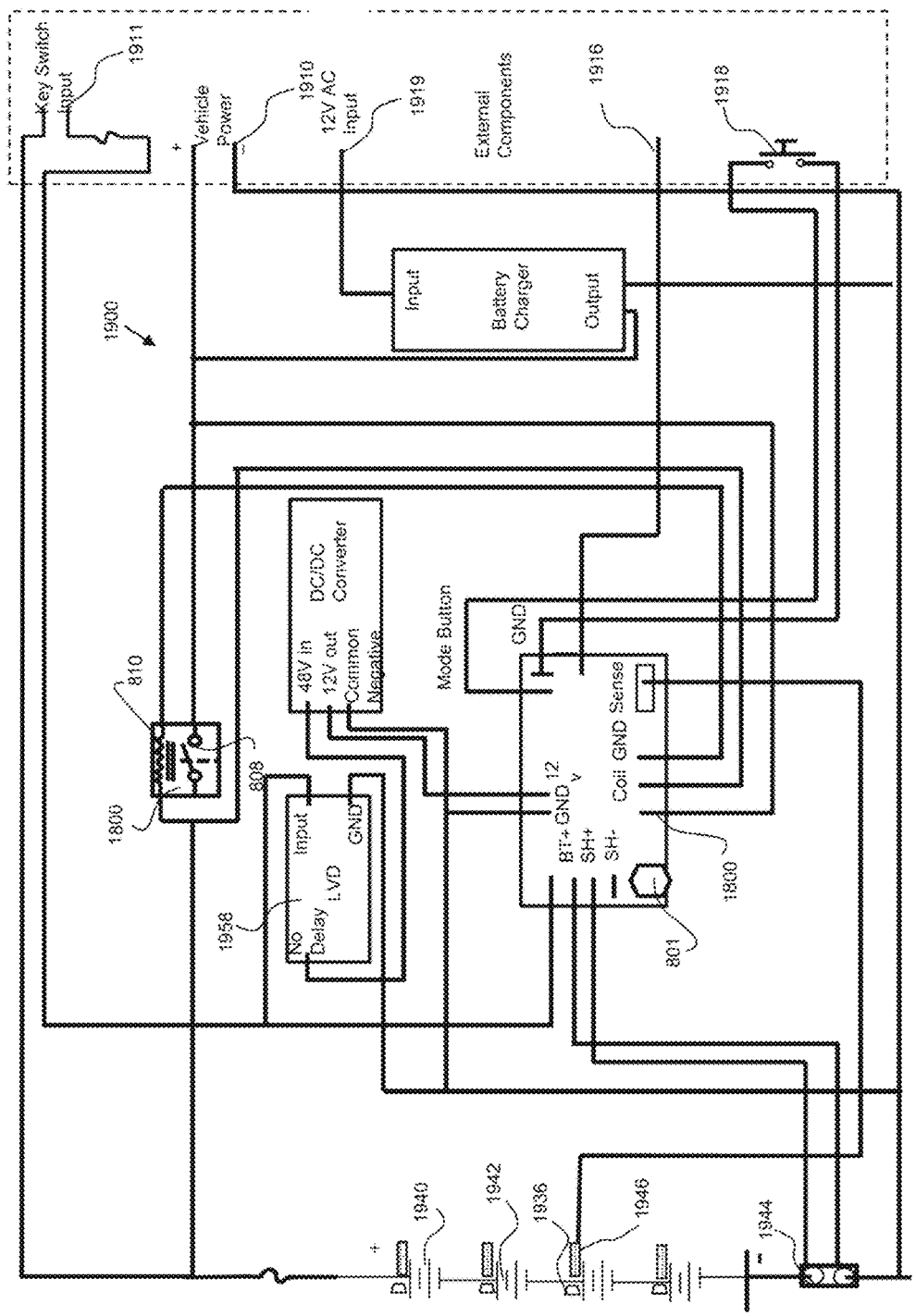
FIG. 32 shows a diagram of a circuit of an exemplary automatic rechargeable battery control module having an automatic control system for automatically switching between charging mode to a discharging mode.

FIG. 32 shows a diagram of a circuit of an exemplary automatic rechargeable battery control module having an automatic control system for automatically switching between charging mode to a discharging mode.

FIG. 32 shows a circuit diagram for an exemplary automatic rechargeable battery control module 1900 comprising a battery pack 1942 having a plurality of batteries 1940, and an automatic control system 1800 that automatically switches from a charging mode to a discharging mode and does not require any manual resetting to switch from one mode to the other. In addition, the automatic control system also monitors the battery or battery pack and the state of charge to prevent overcharging or dropping below a lower threshold state of charge. Sense boards 1946 are coupled with each of the batteries 1940 and communicate a state of charge of the battery with the automatic control system 1800. A low voltage disconnect circuit 1958 disconnects the battery pack 1942 from a load in the event the battery pack drops below a discharge threshold value and turns off the automatic rechargeable battery control module if the state of charge of the battery pack drops below critical threshold value. The automatic control system 1800 including the microprocessor 801, sensors 1936 and sense boards 1946, are powered by power from the battery pack, typically at 12V. This is a parasitic load on the battery pack and in the event that there is no power to charge the battery pack for an extended period of time, the battery pack may drop below a critical threshold state of charge and the automatic rechargeable battery control module may turn off to prevent damage to the batteries. The automatic control system 1800 comprises a relay contactor 808 having a parallel resistor 810 that enables determination of the requirement of charging or discharging mode, as described herein and as shown in FIG. 24. In addition, temperature sensors 1936 are coupled with the batteries 1940 to monitor the individual temperature of each the batteries. In the event that one of the batteries exceeds and upper threshold temperature limit, the battery or battery pack may be disconnected from the load and/or power source. The automatic rechargeable battery control module 1900 has an on/off switch 1920 which may be any suitable user interface to turn the module on and off and may be connected with a key switch 1911, when adapted for a vehicle. The automatic rechargeable battery control module 1900 has an automatic battery control circuit 1930, as generally shown in FIG. 24. The shunt 1944 is shown configured between the battery pack 1942 and the automatic control system 1800.

It will be apparent to those skilled in the art that various modifications, combinations and variations can be made in the present invention without departing from the spirit or scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:

1. An automatic rechargeable battery control module comprising:
   a) a module housing comprising:
      i) a plurality of rechargeable batteries;
   b) a power connector;
   c) a charging port;
   d) an automatic battery control system comprising:
      i) a battery unit;
      ii) a microprocessor;
      iii) a battery management system that measures a state of charge of said battery unit and comprises:
         an over-voltage output that provides an over-voltage signal to said microprocessor when the battery unit has a measured state of charge greater than an upper threshold limit;
         an under-voltage output that provides an under-voltage signal to said microprocessor when the battery unit has a measured state of charge less than a lower threshold limit; and
         a current flow output that provides a current signal of current flow direction into or out of said battery to said microprocessor;
      iv) an automatic battery control circuit coupled to the battery management system, the microprocessor and the battery unit and comprising:
         a relay comprising:
            a single relay contactor extending from an input side to an output side;
            a transistor; and
            a parallel resistor configured in parallel with the relay contactor from said input side to said output side;
         a discharge optocoupler coupled between the automatic battery control circuit and the microprocessor;
         a charge optocoupler coupled between the automatic battery control circuit and the microprocessor;
         a difference amplifier that senses a relay potential that is a voltage potential across the parallel resistor and communicates with the discharge optocoupler and charge optocoupler;
      wherein the discharge optocoupler sends a signal to the microprocessor when the relay potential from the inlet to outlet side is positive;
      wherein the charge optocoupler sends a signal to the microprocessor when the relay potential from the inlet to outlet side is negative;
      wherein with the relay contactor open, a reduction in an output side voltage of the output side is indicated by the discharge optocoupler to the microprocessor, and when the battery is above a threshold discharge limit, the relay contactor is closed by said transistor and the battery unit is connected to a load and place the automatic battery control system in a discharge mode; and
      wherein with the relay contactor open, an increase in the output side voltage of the output side is indicated by the charge optocoupler to the microprocessor, and when the battery is below a threshold charge limit, the relay contactor is closed by said transistor to connect the battery unit to a charging power source to place the automatic battery control system in a charge mode;

wherein the automatic rechargeable battery control module measures a state of charge of the battery unit;

wherein the state of charge is provided to a state of charge indicator; and wherein the state of charge indicator receives a state of charge from the automatic rechargeable battery control module and displays said state of charge on the state of charge indicator.

2. The automatic rechargeable battery control module of claim 1, wherein when in said discharge mode and when no under-voltage signal is received by the microprocessor from the under-voltage output the relay contactor remains closed and the relay potential will be substantially zero, and the output of the discharge optocoupler will turn off preventing said over-voltage signal from causing the relay to be opened;

wherein the relay will remain closed as long as the current flow output provides a current signal of a current flowing to the load; and wherein when said current signal of a current flowing to the load from the battery unit stops, the microprocessor will open the relay contactor thereby isolating the battery unit from the load.

3. The automatic rechargeable battery control module of claim 2, wherein the microprocessor opens the relay contactor when the battery unit drops below the lower threshold limit.

4. The automatic rechargeable battery control module of claim 1, wherein when in said charge mode and when no over-voltage signal is received by the microprocessor from the over-voltage output, the relay contactor remains closed and the relay potential will be substantially zero, and the output of charge optocoupler will turn off preventing any under-voltage signals from causing the relay to be opened; and wherein the relay will remain closed as long as the current flow output provides a current signal of a current flowing to the battery unit; and wherein when said current signal of a current flowing to the battery unit stops, the microprocessor will open the relay contactor thereby isolating the battery unit from the charging power source.

5. The automatic rechargeable battery control module of claim 4, wherein the microprocessor opens the relay contactor when the battery is above the upper threshold limit.

6. The automatic rechargeable battery control module of claim 1, wherein the upper threshold limit is the same as the threshold discharge limit.

7. The automatic rechargeable battery control module of claim 1, wherein the lower threshold limit is the same as the threshold charge limit.

8. The automatic rechargeable battery control module of claim 1, wherein the upper threshold limit is higher than threshold discharge limit.

9. The automatic rechargeable battery control module of claim 1, wherein the lower threshold limit is lower than threshold charge limit.

10. The automatic rechargeable battery control module of claim 1, wherein the parallel resistor has a resistance value of 10,000 ohms or more.

11. The automatic rechargeable battery control module of claim 1, further comprising a battery unit monitoring module that is electrically connected to the positive terminal and the negative terminal of the battery and measures a state of charge of the battery.

12. The automatic rechargeable battery control module of claim 11, wherein the battery unit monitoring module comprises:
a) an input data request port connected to an output data request port of a computing device of a battery management system; and
b) an output data request port;
c) an output data port connected to the input data port of the computing device.

13. The automatic rechargeable battery control module of claim 1, further comprising a battery management system comprising:
a) a computing device comprising:
i) an output data request port; and
ii) an input data port
b) a first battery unit monitoring coupled with a first battery unit and comprising:
i) an input data request port connected to the output data request port or the computing device; and
ii) an output data request port;
c) an output data port connected to the input data port of the computing device; and
d) a second battery unit monitoring module coupled with a second battery unit and comprising:
i) a single input data request port connected only to the output data request port of the first battery unit monitoring module, therein defining a module connection between said first battery unit monitoring module and said second battery unit monitoring module;
ii) an output data port connected to the input data port of the computing device;
wherein the first battery unit monitoring is a master to said second battery unit monitoring module and the second battery unit monitoring module is a slave to the first battery unit monitoring module;
wherein the first battery unit monitoring module responds to a data request signal from the output data request port of the computing device by transmitting data of the first battery unit to the input data port of the computing device and subsequently transmits a data request to the second battery unit monitoring module through said module connection; and
wherein the second battery unit monitoring module responds to the data request from the output data request port the first battery unit monitoring module by transmitting data of the second battery unit to the input data port of the computing device;
wherein the computing device receives data from the first and second battery unit monitoring modules sequentially after sending a single data request signal to only the first battery unit monitoring module; and
wherein the computing device receives data from the second battery unit monitoring module automatically after receiving data from the first battery unit monitoring module.

14. An automatic rechargeable battery control module comprising:
a) a module housing comprising:
i) a plurality of rechargeable batteries;
b) a power connector;
c) a charging port;
d) an automatic battery control system comprising:
i) a battery unit;
ii) a microprocessor;
iii) a battery management system that measures a state of charge of said battery unit and comprises:

an over-voltage output that provides an over-voltage signal to said microprocessor when the battery unit has a measured state of charge greater than an upper threshold limit;
an under-voltage output that provides an under-voltage signal to said microprocessor when the battery unit has a measured state of charge less than a lower threshold limit; and
a current flow output that provides a current signal of current flow direction into or out of said battery to said microprocessor;
iv) an automatic battery control circuit coupled to the battery management system, the microprocessor and the battery unit and comprising:
a relay comprising:
a signal relay contactor extending from an input side to an output side;
a transistor; and
a parallel resistor configured in parallel with the relay contactor from said input side to said output side;
a discharge optocoupler coupled between the automatic battery control circuit and the microprocessor;
a charge optocoupler coupled between the automatic battery control circuit and the microprocessor;
a difference amplifier that senses a relay potential that is a voltage potential across the parallel resistor and communicates with the discharge optocoupler and charge optocoupler;
wherein the discharge optocoupler sends a signal to the microprocessor when the relay potential from the inlet to outlet side is positive;
wherein the charge optocoupler sends a signal to the microprocessor when the relay potential from the inlet to outlet side is negative;
wherein with the relay contactor open, a reduction in an output side voltage of the output side is indicated by the discharge optocoupler to the microprocessor, and when the battery is above a threshold discharge limit, the relay contactor is closed by said transistor and the battery unit is connected to a load and place the automatic battery control system in a discharge mode; and
wherein with the relay contactor open, an increase in the output side voltage of the output side is indicated by the charge optocoupler to the microprocessor, and when the battery is below a threshold charge limit, the relay contactor is closed by said transistor to connect the battery unit to a charging power source to place the automatic battery control system in a charge mode;
wherein the automatic rechargeable battery control module comprises a video port for connection with an electronic device having a display that displays a metric of the battery unit.

15. A vehicle comprising:
an automatic rechargeable battery control module comprising:
a) a module housing;
b) a battery unit;
c) a microprocessor;
d) a battery management system that measures a state of charge of said battery unit and comprises:
i) an over-voltage output that provides an over-voltage signal to said microprocessor when the battery unit has a measured state of charge greater than an upper threshold limit;
ii) an under-voltage output that provides an under-voltage signal to said microprocessor when the battery unit has a measured state of charge less than a lower threshold limit; and
iii) a current flow output that provides a current signal of current flow direction into or out of said battery to said microprocessor;
e) an automatic battery control circuit coupled to the battery management system, the microprocessor and the battery unit and comprising:
i) a relay comprising:
a single relay contactor extending from an input side to an output side;
a transistor; and
ii) a parallel resistor configured in parallel with the relay contactor from said input side to said output side;
iii) a discharge optocoupler coupled between the automatic battery control circuit and the microprocessor;
iv) a charge optocoupler coupled between the automatic battery control circuit and the microprocessor;
v) a difference amplifier that senses a relay potential that is a voltage potential across the parallel resistor;
wherein with the relay contactor open, a reduction in an output side voltage of the output side is indicated by the discharge optocoupler to the microprocessor, and when the battery is above a threshold discharge limit, the relay contactor is closed by said transistor and the battery unit is connected to a load and place the automatic battery control system in a discharge mode; and
wherein with the relay contactor open, an increase in the output side voltage of the output side is indicated by the charge optocoupler to the microprocessor, and when the battery is below a threshold charge limit, the relay contactor is closed by said transistor to connect the battery unit to the charging power source to place the automatic battery control system in a charge mode
wherein when in said discharge mode and when no under-voltage signal is received by the microprocessor from the under-voltage output the relay contactor remains closed and the relay potential will be substantially zero, and the output of the discharge optocoupler will turn off preventing said over-voltage signal from causing the relay to be opened;
wherein the relay will remain closed as long as the current flow output provides a current signal of a current flowing to the load; and
wherein when said current signal of a current flowing to the load from the battery unit stops, the microprocessor will open the relay contactor thereby isolating the battery unit from the load;
wherein when in said charge mode and when no over-voltage signal is received by the microprocessor from the over-voltage output, the relay contactor remains closed and the relay potential will be substantially zero, and the output of charge optocoupler will turn off preventing any under-voltage signals from causing the relay to be opened; and
wherein the relay will remain closed as long as the current flow output provides a current signal of a current flowing to the battery unit; and wherein when said current signal of a current flowing to the battery unit stops, the microprocessor will open the relay contactor thereby isolating the battery unit from the charging power source;

wherein the automatic rechargeable battery control module measures a state of charge of the battery unit;

wherein the vehicle comprises a state of charge indicator; and wherein the state of charge indicator receives a state of charge from the automatic rechargeable battery control module and displays said state of charge on the state of charge indicator.

16. The vehicle of claim 15, wherein the vehicle is a golf cart.

17. The vehicle of claim 15, wherein the state of charge indicator comprises a state of charge indicator light.

18. The vehicle of claim 15, wherein the automatic rechargeable battery control module comprises a video port for connection with an electronic device having a display that displays a metric of the battery unit.

19. The vehicle of claim 15, wherein the microprocessor opens the relay contactor when the battery unit drops below the lower threshold limit.

20. The vehicle of claim 15, wherein the microprocessor opens the relay contactor when the battery is above the upper threshold limit.

* * * * *